US008852978B2

(12) United States Patent
Choi

(10) Patent No.: US 8,852,978 B2

(45) Date of Patent: Oct. 7, 2014

(54) METHOD OF FABRICATING A THIN FILM TRANSISTOR AND METHOD OF FABRICATING AN ORGANIC LIGHT-EMITTING DISPLAY DEVICE

(75) Inventor: Hee Dong Choi, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 55 days.

(21) Appl. No.: 13/612,278

(22) Filed: Sep. 12, 2012

(65) Prior Publication Data

US 2013/0071963 A1 Mar. 21, 2013

(30) Foreign Application Priority Data

Sep. 20, 2011 (KR) ........................ 10-2011-0094829

(51) Int. Cl.

*H01L 21/336* (2006.01)
*H01L 27/12* (2006.01)
*H01L 29/786* (2006.01)

(52) U.S. Cl.

CPC ...... *H01L 27/1288* (2013.01); *H01L 29/78627* (2013.01); *H01L 27/1255* (2013.01)

USPC ...................... 438/43; 438/159; 257/E21.411

(58) Field of Classification Search

None

See application file for complete search history.

(56) References Cited

U.S. PATENT DOCUMENTS

| | | | | |
|---|---|---|---|---|
| 2001/0008781 A1* | 7/2001 | Lee et al. | ...................... | 438/153 |
| 2007/0040174 A1* | 2/2007 | Kim et al. | ...................... | 257/59 |
| 2008/0044958 A1* | 2/2008 | Hwang | ...................... | 438/154 |
| 2008/0044965 A1* | 2/2008 | Choi et al. | ...................... | 438/166 |
| 2010/0213482 A1* | 8/2010 | Kim et al. | ...................... | 257/98 |
| 2013/0069070 A1* | 3/2013 | Ko | ...................... | 257/72 |

* cited by examiner

*Primary Examiner* — Charles Garber

*Assistant Examiner* — Stanetta Isaac

(74) *Attorney, Agent, or Firm* — Birch, Stewart, Kolasch & Birch, LLP

(57) ABSTRACT

A thin film transistor fabrication method allows forming a first photoresist pattern on a triple layer of insulation, conductive and metal films opposite to a semiconductor pattern. A first metal pattern and a conductive pattern are formed through an etch process before forming source and drain regions through a first ion injection process. A second photoresist pattern with a narrower width than that of the first photoresist pattern is derived from the first photoresist pattern. The first metal pattern is reformed into a second metal pattern with a narrower width than that of the second photoresist pattern. A process is performed that includes removing the second photoresist pattern, forming LDD (Lightly Doped Drain) regions in the semiconductor pattern, and forming GOLDD (Gate Overlap LDD) regions in the semiconductor pattern. A second insulation film is formed before forming source and drain electrodes on the second insulation film.

23 Claims, 20 Drawing Sheets

37 33 39
35
11
3
1
25 23 21a 27a 31 27b 21b
29a 29b

FIG.2C
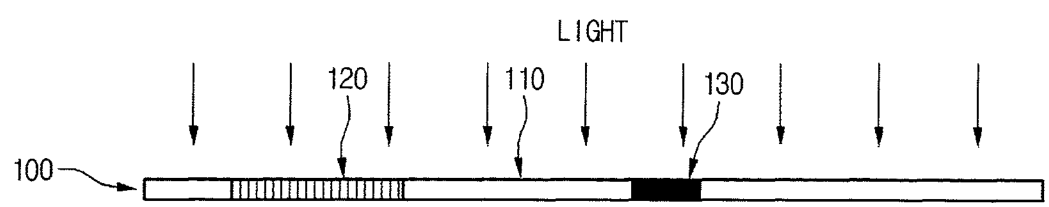
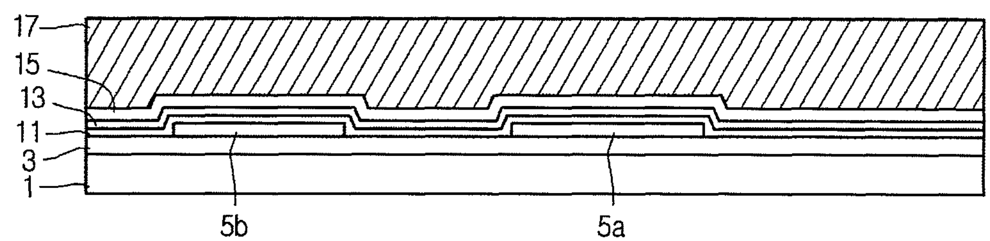
FIG.2D
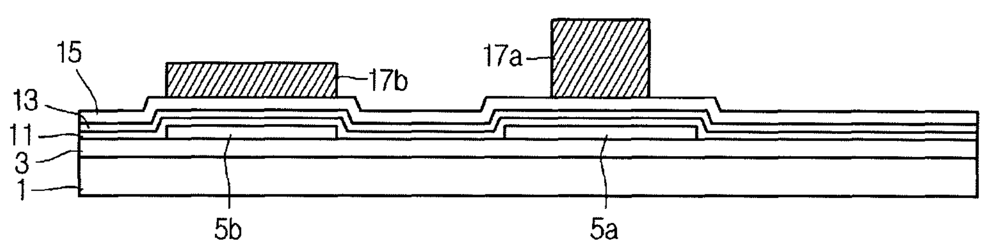
FIG.2E
15
17b
17a
13
11
3
1
5b
5a FIG.4B
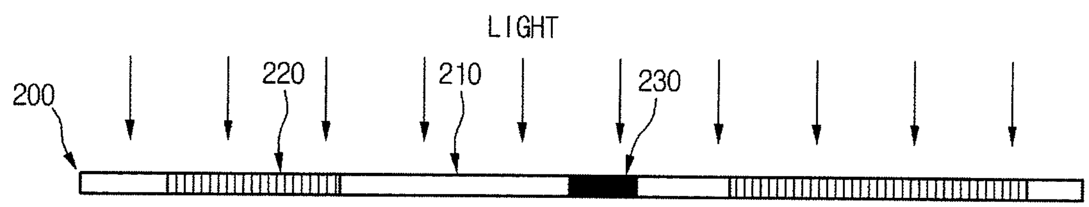
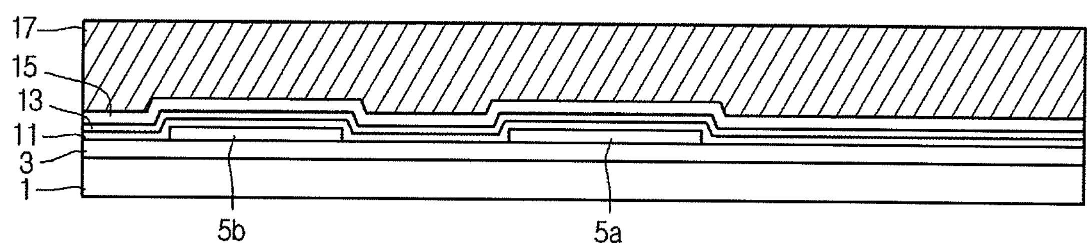
FIG.4C
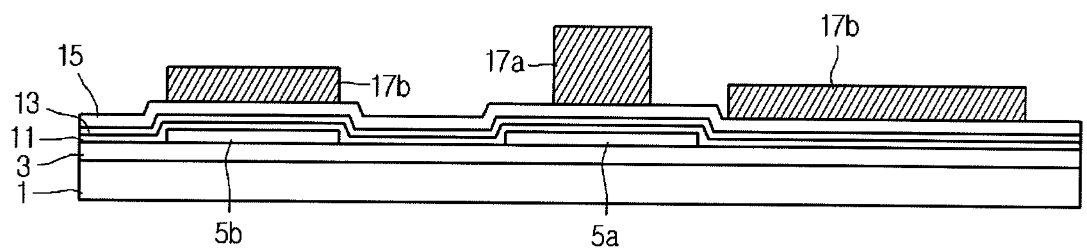
FIG.4D

METHOD OF FABRICATING A THIN FILM TRANSISTOR AND METHOD OF FABRICATING AN ORGANIC LIGHT-EMITTING DISPLAY DEVICE

CROSS REFERENCE TO RELATED APPLICATION

This application claims priority under 35 U.S.C. §119(a) of Korean Patent Application No. 10-2011-0094829 filed on Sep. 20, 2011, which is hereby incorporated by reference in its entirety.

BACKGROUND OF THE INVENTION

1. Field of the Invention

Embodiments relate to a method of fabricating a thin film transistor. Also, embodiment relate to a method of fabricating an organic light-emitting display device.

2. Description of the Related Art

Devices for displaying information are being widely developed. The display devices include liquid crystal display (LCD) devices, organic light-emitting display (OLED) devices, electrophoresis display devices, field emission display (FED) devices, and plasma display devices.

Among these display devices, OLED devices have the features of lower power consumption, wider viewing angle, lighter weight and higher brightness compared to LCD devices. As such, the OLED device is considered to be next generation display devices.

In general, a process of fabricating an OLED device is complex. In other words, a large number of masks are used for fabricating the OLED device.

Due to the complex fabrication process, the fabrication time lengthens, the fabrication cost increases, and the production yield deteriorates.

SUMMARY OF THE INVENTION

Accordingly, embodiments are directed to a thin film transistor fabrication method and an OLED device fabrication method that substantially obviate one or more of problems due to the limitations and disadvantages of the related art.

Embodiments relate to fabrication methods that are adapted to simplify the structures of a thin film transistor and an OLED device with the same by minimizing the number of masks.

Also, embodiments relate to a thin film transistor fabrication method and an OLED device fabrication method that are adapted to reduce fabrication time and cost and to enhance production yield by minimizing the number of masks.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first general aspect according to an embodiment of the invention, a thin film transistor fabrication method includes: forming a semiconductor pattern on a substrate; forming a first insulation film, a conductive film and a metal film on the substrate including the semiconductor pattern; forming a first photoresist pattern on the metal film, the first photoresist pattern having a narrower width than that of the semiconductor pattern; forming a first metal pattern and a conductive pattern by etching the metal film and the conductive film using the first photoresist pattern as a mask; forming a source region and a drain region in the semiconductor pattern by performing a first ion injection process using the first photoresist pattern as a mask; forming a second photoresist pattern through an ashing process, the second photoresist pattern having a narrower width than that of the first photoresist pattern; forming a second metal pattern by etching the first metal pattern using the second photoresist pattern as a mask, wherein the second metal pattern has a narrower width than that of the second photoresist pattern and the second metal pattern and the conductive pattern form a gate electrode; forming LDD (Lightly Doped Drain) regions in the semiconductor pattern through a second ion injection process which uses the second photoresist pattern as a mask; removing the second photoresist pattern; forming GOLDD (Gate Overlap LDD) regions in the semiconductor pattern through a third ion injection process which uses the second metal pattern as a mask; forming a second insulation film on the substrate including the gate electrode; and forming source and drain electrodes, which are electrically connected to the source and drain regions, respectively, on the second insulation film.

According to a second general aspect according to an embodiment of the invention, a OLED device fabrication method includes: forming a semiconductor pattern on a substrate; forming a first insulation film, a conductive film and a metal film on the substrate including the semiconductor pattern; forming a first photoresist pattern on the metal film, the first photoresist pattern having a narrower width than that of the semiconductor pattern; forming a first metal pattern and a conductive pattern by etching the metal film and the conductive film using the first photoresist pattern as a mask; forming a source region and a drain region in the semiconductor pattern by performing a first ion injection process using the first photoresist pattern as a mask; forming a second photoresist pattern from the first photoresist pattern through an ashing process, the second photoresist pattern having a narrower width than that of the first photoresist pattern; forming a second metal pattern by etching the first metal pattern using the second photoresist pattern as a mask, wherein the second metal pattern has a narrower width than that of the second photoresist pattern, and the second metal pattern and the conductive pattern form a gate electrode; performing a process that includes removing the second photoresist pattern, forming LDD (Lightly Doped Drain) regions in the semiconductor pattern, and forming GOLDD (Gate Overlap LDD) regions in the semiconductor pattern; forming a second insulation film on the entire surface of the substrate; forming source and drain electrodes, which are electrically connected to the source and drain regions, respectively, on the second insulation film; forming a first electrode, which is electrically connected to the drain electrode; forming a bank layer with an opening, which exposes the first electrode; and forming an organic light emission layer and a second electrode on the first electrode.

According to a third general aspect according to an embodiment of the invention, an OLED device fabrication method includes: forming first and second semiconductor patterns on a substrate with first through third regions; forming a first insulation film, a conductive film and a metal film on the substrate including the first and second semiconductor patterns; forming first through third photoresist patterns on the metal film corresponding to the first through third regions, while the first photoresist pattern has a narrower width than that of the first semiconductor pattern, and the second photoresist pattern corresponds to the second semiconductor pattern; forming first through third metal patterns and first through third conductive patterns by etching the metal film and the conductive film using the first through third photoresist patterns as a mask; forming a source region and a drain region in the first semiconductor pattern by performing a first ion injection process using the first photoresist pattern as a mask; forming a fourth photoresist pattern from the first photoresist pattern with a narrower width than that of the first photoresist pattern while removing the second and third photoresist patterns by performing an ashing process; forming a fourth metal pattern, a second capacitor electrode and a first electrode, wherein the fourth metal pattern is formed from the first metal pattern by etching the first metal pattern using the fourth photoresist pattern as a mask and has a narrower width than that of the fourth photoresist pattern, and the second capacitor electrode and the first electrode are formed from the second and third conductive patterns by removing the second and third metal patterns, wherein the fourth metal pattern and the first conductive pattern form a gate electrode; removing the fourth photoresist pattern; performing a process that includes removing the second photoresist pattern, forming LDD (Lightly Doped Drain) regions in the semiconductor pattern, and forming GOLDD (Gate Overlap LDD) regions in the semiconductor pattern; forming a second insulation film on the entire surface of the substrate; forming a first opening, which exposes the first electrode, in the second insulation film; forming a source electrode which is electrically connected to the source region, and a drain electrode which is electrically connected to the drain region and the first electrode, on the second insulation film; forming a bank layer with a second opening, which exposes the first electrode, on the second insulation film; and forming an organic light emission layer and a second electrode, which form an organic light-emitting element together with the first electrode, on the first electrode.

According to a fourth general aspect according to an embodiment of the invention, an OLED device fabrication method includes: forming first and second semiconductor patterns on a substrate with first through third regions; forming a first insulation film, a conductive film and a first metal film on the substrate including the first and second semiconductor patterns; forming first through third photoresist patterns on the metal film corresponding to the first through third regions, while the first photoresist pattern has a narrower width than that of the first semiconductor pattern, and the second photoresist pattern corresponds to the second semiconductor pattern; forming first through third metal patterns and first through third conductive patterns by etching the first metal film and the conductive film using the first through third photoresist patterns as a mask; forming a source region and a drain region in the first semiconductor pattern by performing a first ion injection process using the first photoresist pattern as a mask; forming fourth and fifth photoresist patterns by performing an ashing process while fourth photoresist pattern has a narrower width than that of the first photoresist pattern; forming a fourth metal pattern and a second capacitor electrode, wherein the fourth metal pattern is formed from the first metal pattern by etching the first metal pattern using the fourth photoresist pattern as a mask and has a narrower width than that of the fourth photoresist pattern, and the second capacitor electrode is formed from the second conductive pattern; removing the fourth and fifth photoresist patterns; performing a process that includes removing the second photoresist pattern, forming LDD (Lightly Doped Drain) regions in the semiconductor pattern, and forming GOLDD (Gate Overlap LDD) regions in the semiconductor pattern; forming a second insulation film on the entire surface of the substrate; forming a first opening, which exposes the third metal pattern, in the second insulation film; forming a source electrode, a drain electrode, a connection electrode and a first electrode by depositing a second metal film on the second insulation film and patterning the second metal film and the third metal pattern; forming a bank layer with a second opening, which exposes the first electrode, on the second insulation film; and forming an organic light emission layer and a second electrode, which form an organic light-emitting element together with the first electrode, on the first electrode.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the invention are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiments of the invention and together with the description serve to explain the disclosure. In the drawings:

FIGS. 2A through 2M are cross-sectional views illustrating a method of fabricating a top emission type OLED device according to a second embodiment of the invention;

FIGS. 4A through 4I are cross-sectional views illustrating a method of fabricating a bottom emission type OLED device according to a fourth embodiment of the invention;

DETAILED DESCRIPTION OF THE EMBODIMENTS

Figure 1A:
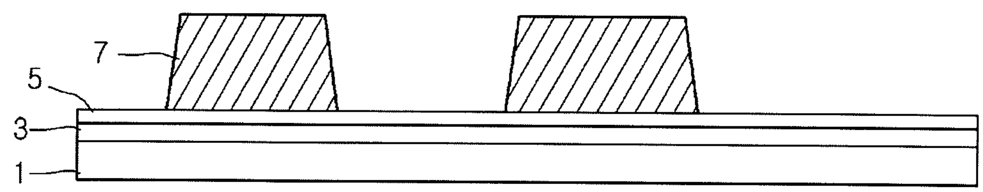
FIGS. 1A through 1N are cross-sectional views illustrating a method of fabricating a top emission type OLED device according to a first embodiment of the invention.

In embodiments of the invention, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings.

Reference will now be made in detail to the embodiments of the invention, examples of which are illustrated in the accompanying drawings. In the drawings, the sizes and thicknesses of elements can be exaggerated, omitted or simplified for clarity and convenience of explanation, but they do not refer to the practical sizes of elements.

First and second embodiments disclose top emission type OLED devices which emit light in an upward direction of a substrate.

The top emission type OLED devices can be ordinarily applied to relatively small-sized screens. Such small-sized OLED devices can enable a thin film transistor and an organic light-emitting element, which are arranged on a substrate, to overlap with each other. In this instance, light emitted from the organic light-emitting element cannot progress toward a downward direction of the substrate. Due to this, the top emission type OLED device must have the structure of emitting light toward the upward direction of the substrate. However, the top emission type OLED devices in accordance with the first and second embodiments can be applied to, for example, relatively large-sized screens.

Third and fifth embodiments disclose bottom emission type OLED devices which emit light in a downward direction of a substrate.

The bottom emission type OLED devices can be ordinarily applied to relatively large-sized screens. Such large-sized OLED devices can force a thin film transistor and an organic light-emitting element, which are arranged on a substrate, not to overlap with each other. However, the bottom emission type OLED devices in accordance with the third through fifth embodiments can be applied to, for example, relatively small-sized screens.

The largest structural difference between the OLED devices of the top and bottom emission types is whether a surface-planarized insulation film, which is used to compensate for a step coverage caused by the transistor, exists or not. More specifically, the top emission type OLED device includes the surface-planarized insulation film, but the bottom emission type OLED device does not include the surface-planarized insulation film.

Meanwhile, in both the top and bottom emission type OLED devices, the other components can selectively increase or decrease as needed.

Figure 1B:
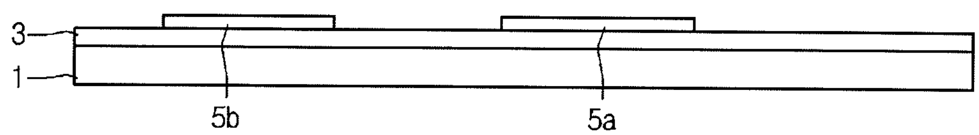
Figure 1C:
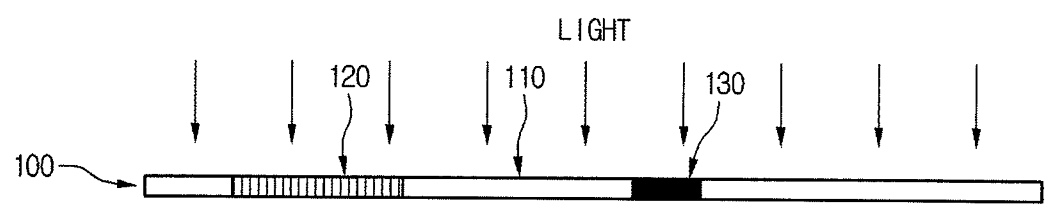
Figure 1D:
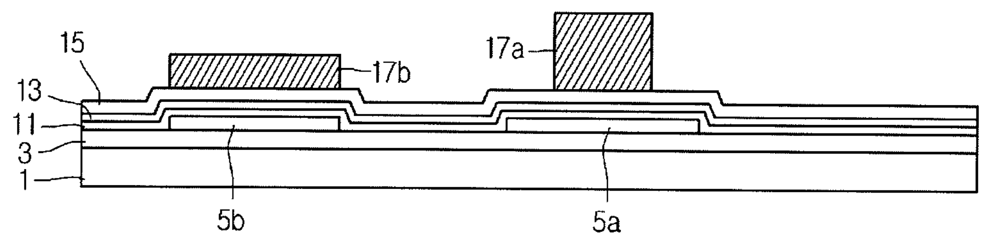
Figure 1E:
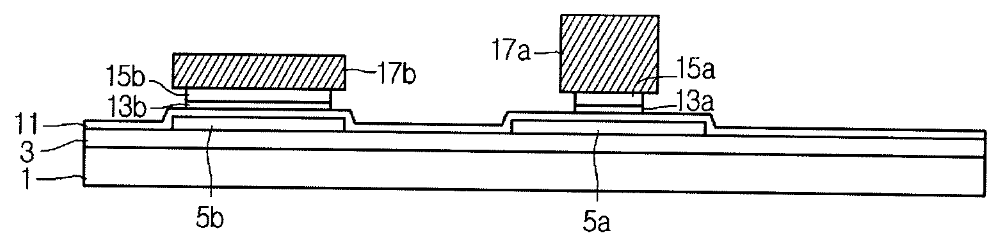
Figure 1F:
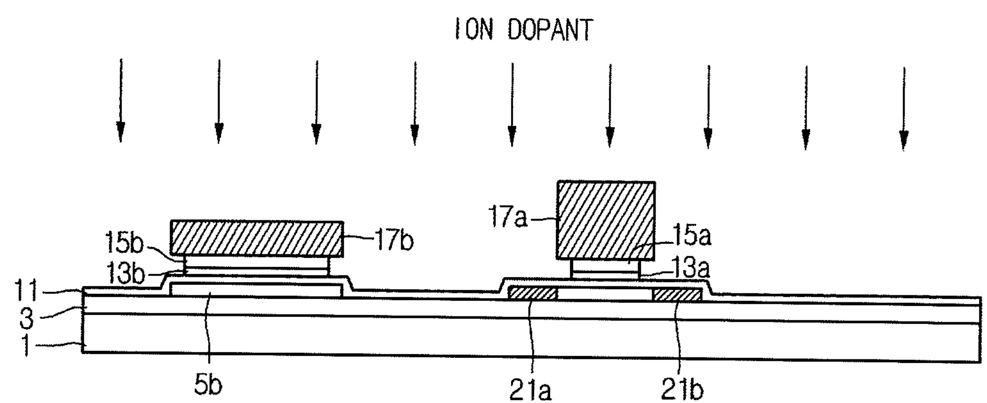
Figure 1G:
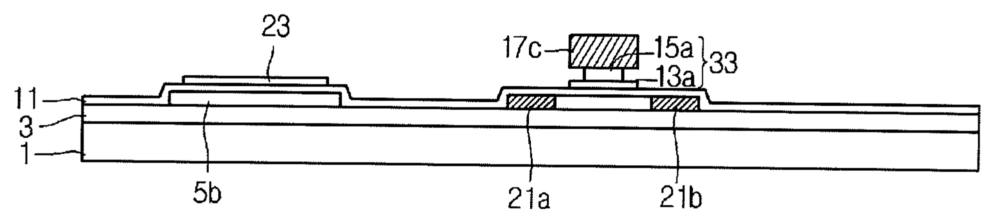
Figure 1H:
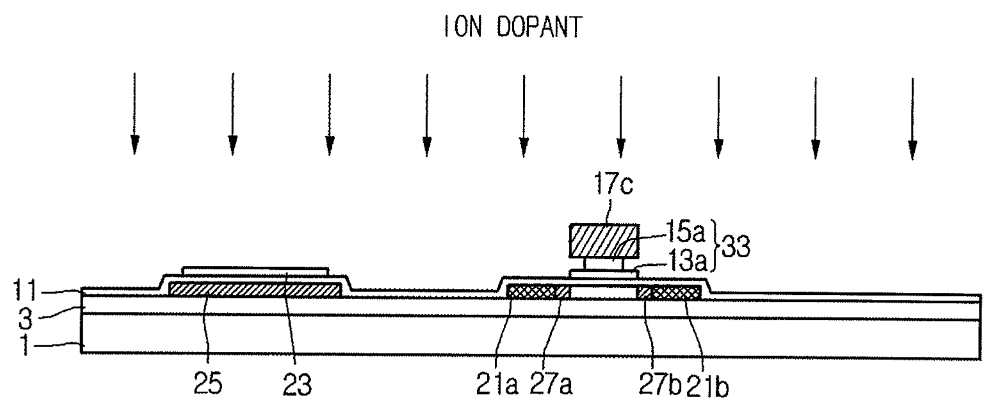
Figure 1I:
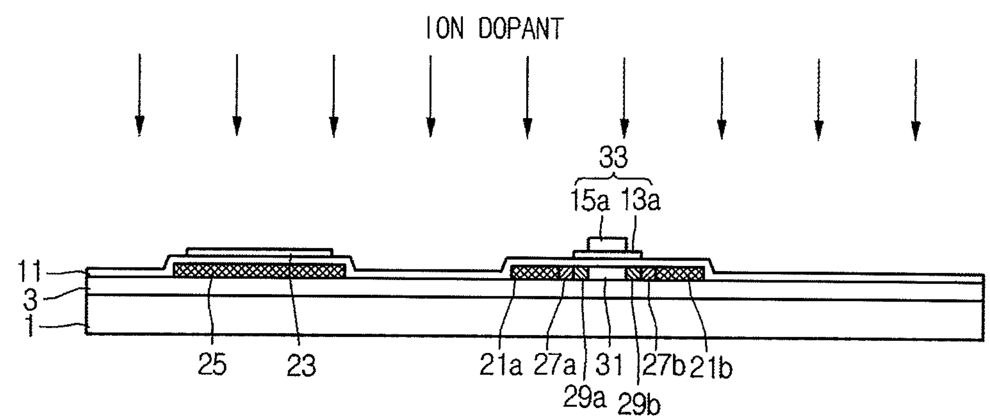
Figure 1J:
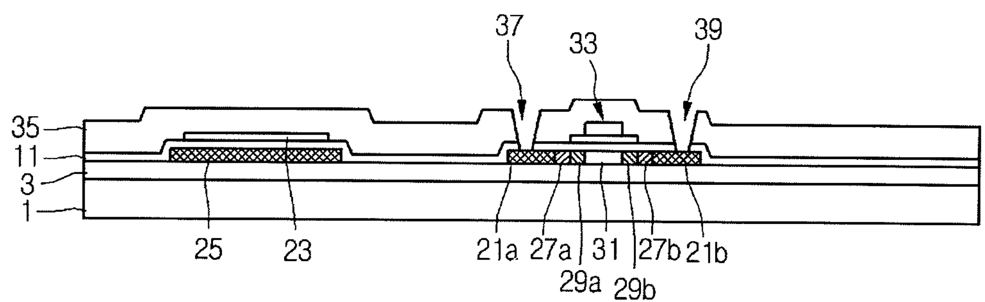
Figure 1K:
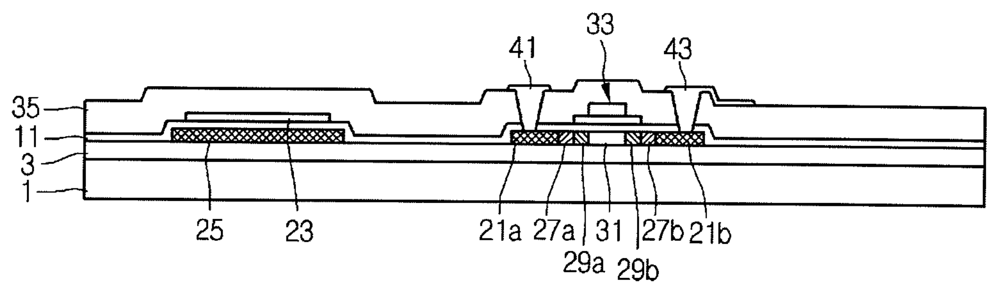
Figure 1L:
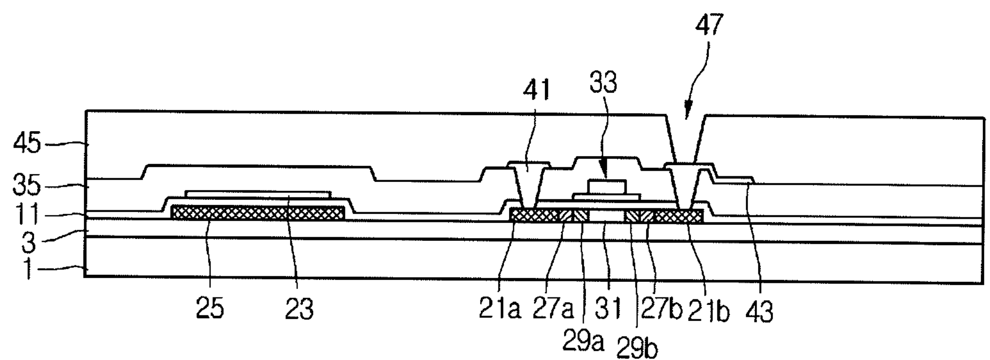
Figure 1M:
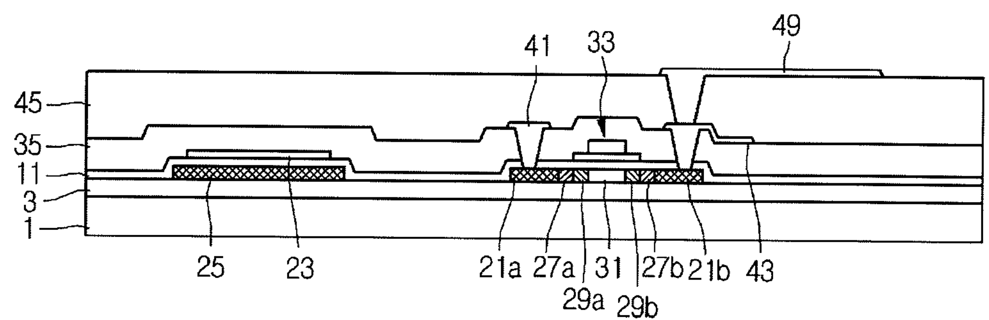
Figure 1N:
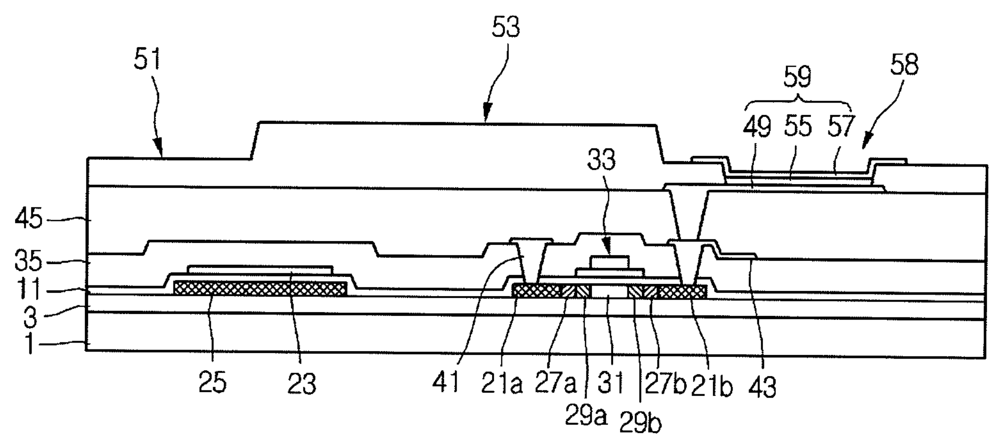

FIGS. 1A through 1N are cross-sectional views illustrating a method of fabricating a top emission type OLED device according to a first embodiment of the invention.

As shown in FIG. 1A, a buffer layer 3 can be formed on a substrate 1. Also, a semiconductor film 5 with an amorphous structure can be formed on the buffer layer 3. The semiconductor film 5 can be crystallized through a heat treatment.

The substrate 1 can include one material selected from a material group including glass, a plastic material, a metal material, a semiconductor material and a ceramic material. However, the substrate 1 is not limited to the above-mentioned material group.

The buffer layer 3 can allow the semiconductor film 5 to be easily formed on the substrate 1. Meanwhile, the buffer layer 3 can be formed to protect the semiconductor film 5. Such a buffer layer 3 can include either a single layer configured with one of a silicon oxide film, a silicon nitride film and a silicon oxynitride film, or multiple layers thereof.

The semiconductor film 5 can include, for example, an amorphous silicon material. The silicon film 5 can be formed through a sputtering process, a low pressure chemical vapor deposition (LPCVD) process or a plasma CVD process, but is not limited to these processes. The silicon film 5 can be crystallized, for example, through a heat treatment, i.e., by irradiating a laser bean thereon. The crystallized semiconductor film can have, for example, the characteristics of polysilicon. Polysilicon can have enhanced electron mobility compared to amorphous silicon. In accordance therewith, a thin film transistor, which includes such a semiconductor film 5 with the characteristics of polysilicon, can be switched at high speeds.

A photoresist pattern 7 can be formed by coating a photoresist film on the crystallized semiconductor film 5 and enabling the photoresist film to be exposed to light. The photoresist film can include either a positive photoresist material, which allows a region exposed to light to be removed, or a negative photoresist material which enables a region not exposed to light to be removed.

As shown in FIG. 1B, an etch process can be performed for the semiconductor film 5 using the photoresist pattern as a mask, thereby forming first and second semiconductor patterns 5*a* and 5*b*. The first semiconductor pattern 5*a* can be used as a semiconductor pattern for a thin film transistor. The second semiconductor pattern 5*b* can be used as a first capacitor electrode.

A first insulation film 11 can be formed on the entire surface of the above-mentioned substrate 1, as shown in FIG. 1C. The first insulation film 11 can include either a signal layer of a silicon oxide, a silicon nitride or a silicon oxynitride film, or multiple layers thereof, but is not limited to this.

A conductive film 13 and a metal film 15 can be sequentially formed on the first insulation film 11. Also, a second photoresist film 17 can be formed on the metal film 15 before a half tone mask 100 is disposed over the second photoresist film 17.

The conductive film 13 can be formed from a transparent conductive material. As an example of the transparent conductive film 13, a single layer or multiple layers, which is or are formed from at least one material selected from a material group including ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx and RuOx/ITO, can be employed. However, the conductive film is not limited to the transparent material group. Light and a dopant can penetrate the conductive film 13.

The metal film 15 can be formed from an opaque conductive material or a metal material. As an example of the metal film 15, a single layer or multiple layers, which is or are formed from at least one material selected from an opaque conductive material group including Au, Al, Ag, Ti, Cu, Ni, Pt, Mo, W, Ta and Cr, can be used. However, the metal film 15 is not limited to the opaque conductive material group. For example, the metal film 15 can have a three layer structure of Mo/Al/Mo, but is not limited to this.

Also, light and a dopant do not penetrate the metal film 15. As such, the metal film 15 can be used as a mask preventing dopant penetration when a doping process for injecting ions is performed.

The second photoresist film 17 can include any one of positive and negative photoresist materials, as explained above.

The half tone mask 100 can include transmission regions 110, a semi-transmission region 120 and an interception region 130. The transmission regions 110 transmit light through them. The semi-transmission region 120 partially transmits light through it. As such, the quantity of light passing through the semi-transmission region 120 is smaller compared to the light quantity passing through the transmission region 110. The interception region 130 intercepts light.

An exposure process of irradiating light can be performed for the half tone mask 100. In this instance, light passing through the transmission regions 110 and the semi-transmission region 120 of the half tone mask 100 can be irradiated to the second photoresist film 17. Meanwhile, light progressing toward the interception region 130 of the half tone mask 100 cannot be irradiated to the second photoresist film 17 because the light is shielded by the interception region 130.

Also, a light quantity passing through the transmission region 110 is different from a light quantity passing through the semi-transmission region 120. In other words, the light quantity passing through the transmission region 110 is greater than the light quantity passing through the semi-transmission region 120. As such, a first portion of the second photoresist film 17, which is exposed to light passing through the transmission region 110, and a second portion part of the second photoresist film 17, which is exposed light passing through the semi-transmission region 120, are different from each other in hardening degree. More specifically, the first portion of the second photoresist film 17, which is exposed to light passing through the transmission region 110, is entirely hardened in thickness. Meanwhile, the second portion of the second photoresist film 17, which is exposed to light passing through the semi-transmission region 120, is not entirely hardened in thickness. In other words, the second portion of the second photoresist film 17 can be hardened to a fixed depth from the surface of the second photoresist film 17. For example, the second portion of the second photoresist film 17 can be hardened by half of the entire thickness.

If the second photoresist film 17 is a positive photoresist film, a third portion of the second photoresist film facing the interception region 130 remains without being removed even though a development process is performed for the second photoresist film 17. In accordance therewith, a first photoresist pattern 17*a* can be formed as shown in FIG. 1D.

When the development process is performed, the first portion of the second photoresist film 17 facing the transmission region 110 is entirely removed, but the second portion of the second photoresist film facing the semi-transmission region 120 is partially removed in thickness. For example, the second portion of the second photoresist film 17 can be removed by half of the full thickness and the other half can remain. Therefore, a second photoresist pattern 17*b* can be formed by partially removing the second portion of the second photoresist film 17 through the development process.

As shown in FIG. 1E, an etch process using the first and second photoresist patterns 17*a* and 17*b* as a mask can be performed. Through the etch process, the metal film 15 can be selectively removed, and then the conductive film 13 under the metal film 15 can be selectively removed. Also, the metal film 15 and the conductive film 13 can be over etched in order to obtain narrower widths than those of the first and second photoresist patterns 17*a* and 17*b*.

In accordance therewith, a first conductive pattern 13*a* and a first metal pattern 15*a* can be formed on the first insulation film 11 opposite to the first semiconductor pattern 5*a*. Also, a second conductive pattern 13*b* and a second metal pattern 15*b* can be formed on the first insulation film 11 opposite to the second semiconductor pattern 5*b*. The first conductive pattern 13*a* and the first metal pattern 15*a* can have a narrower width than that of the first photoresist pattern 17*a*.

As both the conductive film 13 and the metal film 15 are etched substantially using the same photoresist pattern, i.e., the first photoresist pattern 17*a*, as a mask, the first conductive pattern 13*a* and the first metal pattern 15*a* can substantially have the same size or width. Similarly, the second conductive pattern 13*b* and the second metal pattern 15*b* can substantially have the same size or width, because both the conductive and metal films 13 and 15 are etched substantially using the same photoresist pattern, i.e., the second photoresist pattern 17*b*, as a mask. However, the first and second conductive patterns 13*a* and 13*b* and the first and second metal patterns 15*a* and 15*b* are not limited to these.

The first photoresist pattern 17*a* can have a smaller size or a narrow width compared to the first semiconductor pattern 5*a*. As such, the first photoresist pattern 17*a* is formed only on the center portion of the first semiconductor pattern 5*a* without being present on edges of the first semiconductor pattern 5*a*. Meanwhile, the second photoresist pattern 17*b* can have a substantially equal size or width to that of the second semiconductor pattern 5*b*, or a larger size or wider width than that of the second semiconductor pattern 5*b*.

As such, although a doping process is performed for the above-mentioned substrate 1, an ion dopant cannot be injected into the second semiconductor pattern 5*b* facing the second photoresist pattern 17*b* because the ion dopant is shielded by the second photoresist pattern 17*b*. Meanwhile, as the first photoresist pattern 17*a* has a smaller size or a narrower width compared to the first semiconductor pattern 5*a*, the ion dopant is injected into only the edges of the first semiconductor pattern 5*a* not covered with the first photoresist pattern 17*a*, except the center portion of the first semiconductor pattern 5*a* covered with the first photoresist pattern 17*a*.

As shown in FIG. 1F, an ion injection process can be first performed using the first and second photoresist patterns 17*a* and 17*b* as a mask.

At this time, an ion dopant is injected into the edges of the first semiconductor pattern 5*a* not covered with the first photoresist pattern 17*a*, i.e., a rim portion or side portions of the first semiconductor pattern 5*a* exposed by the first photoresist pattern 17*a*, because the first photoresist pattern 17*a* has a smaller size or a narrower width compared to the first semiconductor pattern 5*a*. In accordance therewith, a source region 21*a* and a drain region 21*b* each including the ion dopant can be formed.

On the other hand, the ion dopant is shielded by the second photoresist pattern 17*b* and is not injected into the second semiconductor pattern 5*b* facing the second photoresist pattern 17*b*. This results from the fact that the second photoresist pattern 17*b* sufficiently covers the second semiconductor pattern 5*b*.

As shown in FIG. 1G, an ashing process can be performed for the first and second photoresist patterns 17*a* and 17*b*. Such an ashing process can decrease the thicknesses or the widths of the first and second photoresist patterns 17*a* and 17*b*. The ashing process can proceed until the second photoresist pattern 17*b* is completely removed. When the second photoresist pattern 17*b* is completely removed, the first photoresist pattern 17*a* can be reformed (or changed) into a third photoresist pattern 17*c* with a thinned thickness and a narrowed width. This results from the fact that the thickness of the first photoresist pattern 17*a* is larger than that of the second photoresist pattern 17*b*.

It is necessary to attain a narrower width of the third photoresist pattern 17*c* compared to the first photoresist pattern 17*a*. In view of this point, it is possible to inject ions into the first semiconductor pattern 5*a* corresponding to a rim portion or side portions of the first photoresist pattern 17*a* which can be exposed by the third photoresist pattern 17*c*.

Also, the third photoresist pattern 17*c* can have a substantially equal size or width to that of the first conductive pattern 13*a*. As such, it is possible to inject ions into the first semiconductor pattern 5*a* corresponding to both side portions of the first photoresist pattern 17*a* which can be exposed by the first conductive pattern 13*a*.

Another etch process can be performed using the third photoresist pattern 17*c* as a mask. At this time, an over etch for removing edge portions of the first metal pattern 15*a* can be performed. In accordance therewith, the first metal pattern 15*a* can have a smaller size or a narrower width than that of the first conductive pattern 13*a*. In other words, the first metal pattern 15*a* does not exist on the edge portions of the conductive pattern 13*a*.

The over etched first metal pattern 15*a* and the conductive pattern 13*a* can be used as a gate electrode 33.

Through another etch process, the second metal pattern 15*b* on the second conductive pattern 13*b* is completely removed so that only the second conductive pattern 13*b* remains. The second conductive pattern 13*b* can become a second capacitor electrode 23.

A second ion injection process can be performed using the third photoresist pattern 17*c*, as shown in FIG. 1H. During the second ion injection process, the ion dopant can be injected into the first semiconductor pattern 5*a* between the third photoresist pattern 17*c* and the source and drain regions 21*a* and 21*b*, respectively. In accordance therewith, the first semiconductor pattern 5*a* opposite to the rim portion or side portions of the first photoresist pattern 17*a*, which can be exposed by the first conductive pattern 13*a*, can become LDD (Lightly Doped Drain) regions 27*a* and 27*b*.

The LDD regions 27*a* and 27*b* can enhance electrical characteristics of the thin film transistor. For example, the LDD regions 27*a* and 27*b* can enhance an off current characteristic of the thin film transistor, but is not limited to this.

The ion dopant can also be injected into the source region 21*a* and the drain region 21*b*.

Furthermore, the ion dopant can be injected into the second semiconductor pattern 5*b* under the second capacitor electrode 23 by passing through the second capacitor electrode 23. As such, the second semiconductor pattern 5*b* including the ion dopant can become a first capacitor electrode 25. Therefore, the first and second capacitor electrodes 25 and 23 together with the first insulation film 11 therebetween can form a capacitor.

The first embodiment can simultaneously form the LDD regions 27*a* and 27*b* and the first capacitor electrode 25. Therefore, the first embodiment can reduce the number of masks, compared to a method of individually forming the LDD regions 27*a* and 27*b* and the first capacitor electrode 25.

The third photoresist pattern 17*c* can be removed through a stripping process, as shown in FIG. 1I.

Subsequently, a third ion injection process can be performed using the first metal pattern 15*a* as a mask. At this time, the ion dopant can be injected into the source region 21*a*, the drain region 21*b*, the LDD regions 27*a* and 27*b* and the first capacitor electrode 25.

Moreover, the ion dopant can be injected in the first semiconductor pattern 5*a* corresponding to a rim portion or side portions of the first conductive pattern 13*a* which is or are exposed by the first metal pattern 15*a*, thereby forming GOLDD (Gate Overlap LDD) regions 29*a* and 29*b*. To this end, the ion dopant can be injected into the first semiconductor pattern 5*a* after passing through the first conductive pattern 13*a*.

The GOLDD regions 29*a* and 29*b* further can enhance electrical characteristics of the thin film transistor. For example, the GOLDD regions 29*a* and 29*b* further can enhance an off current characteristic of the thin film transistor, but is not limited to this.

In this manner, the LDD regions 27*a* and 27*b* and the GOLDD regions 29*a* and 29*b* are formed. As such, the first embodiment can enhance electrical characteristics of the thin film transistor.

Meanwhile, the ion dopant is shielded by the first metal pattern 15*a*. As such, the ion dopant cannot be injected into a center portion of the first semiconductor pattern 5*a* opposite to the first metal pattern 15*a*. The center portion of the first semiconductor pattern 5*a* not including the ion dopant can become an active region 31.

In accordance therewith, a semiconductor pattern, which includes the active region 31, the GOLDD regions 29*a* and 29*b*, the LDD regions 27*a* and 27*b* and the source and drain regions 21*a* and 21*b*, can be formed.

The GOLDD region 29*a* and the LDD region 27*a* can be formed between the active region 31 and the source region 21*a*. Also, the GOLDD region 29*b* and the LDD region 27*b* can be formed between the active region 31 and the drain region 21*b*. In other words, the GOLDD region 29*a* and 29*b*, the LDD regions 27*a* and 27*b* and the source or drain region 21*a* or 21*b* can be sequentially formed in both sides of the active region 31.

The doping density can gradually increases along a sequence of the GOLDD region 29*a* or 20*b*, the LDD region 27*a* or 27*b* and the source or drain region 21*a* or 21*b*.

The active region 31 can be positioned at the center portion of the first semiconductor pattern 5*a*. The source and drain regions 21*a* and 21*b* are positioned both edge portions of the first semiconductor pattern 5*a*. The GOLDD regions 29*a* and 29*b* and the LDD regions 27*a* and 27*b* can be positioned between the center portion and the edge portions of the first semiconductor pattern 5*a*.

According to the first embodiment, a semiconductor pattern, which includes the active region 31, the GOLDD regions 29*a* and 29*b*, the LDD regions 27*a* and 27*b* and the source and drain regions 21*a* and 21*b*, can be formed by performing the first through third ion injection processes.

As shown in FIG. 1J, a second insulation film 35 can be formed on the gate electrode 33, the second capacitor electrode 23 and the first insulation film 11. Then, first and second contact holes 37 and 39 (or first and second through holes) can be formed in the second insulation film 35.

The first contact hole 37 exposes a part of the source region 21*a*. The second contact hole 39 exposes a part of the drain region 21*b*.

The second insulation film 35 can include one of an inorganic insulation material and an organic insulation material. As an example of the second insulation film 35 including the inorganic insulation material, single layers such as a silicon oxide film, silicon nitride film or silicon oxynitride film and multiple layers configured with a combination thereof can be employed. On the other hand, as an example of the organic insulation material, a polyimide-based material or a photo acrylic based material can be used but it is not limited to this.

As shown in FIG. 1K, a source electrode 41 can be formed in the first contact hole 37 and on a portion of the second insulation film 35 surrounding the first contact hole 37. Also, a drain electrode 43 can be formed in the second contact hole 39 and on another portion of the second insulation film 35 surrounding the second contact hole 39. The source electrode 41 can be electrically connected to the source region 21*a* of the first semiconductor pattern 5*a* through the first contact hole 37. The drain electrode 43 can be electrically connected to the drain region 21*b* of the first semiconductor pattern 5*a* through the second contact hole 39.

The source and drain electrodes 41 and 43 can be formed from a metal material. The metal material can include at least one selected from a metal group which includes Au, Al, Ag, Ti, Cu, Ni, Pt, Mo, W, Ta and Cr. The source and drain electrodes 41 and 43 can be formed in a single layer or multiple layers which is or are formed from at least one material selected from the metal group, but are not limited to these.

A thin film transistor can be formed by the above-mentioned semiconductor pattern, the gate electrode 33, the source electrode 41 and the drain electrode 43. Such a thin film transistor can be used in an OLED device as switching, driving and sensing transistors. The sensing transistor can be used to compensate for a threshold voltage of the driving transistor.

The OLED device can be defined into a plurality of pixel regions. A plurality of thin film transistors, an organic light-emitting element and a capacitor can be formed in each of the pixel regions.

A third insulation film 45 can be formed on the source and drain electrodes 41 and 43 and the second insulation film 35, as shown in FIG. 1L. Also, a third contact hole 47 (or a third through hole) can be formed in the third insulation film 45.

The third contact hole 47 can expose a part of the drain electrode 43.

The third insulation film 45 can include one of an inorganic insulation material and an organic insulation material which are substantially equal or similar to the second insulation film 35. As an example of the third insulation film 45 including the inorganic insulation material, a single layer such as a silicon oxide film, silicon nitride film or silicon oxynitride film and multiple layers configured with a combination thereof can be employed. On the other hand, as an example of the organic insulation material, a polyimide-based material or a photo acrylic based material can be used, but it is not limited to this.

Also, the third insulation film 45 must be formed in relative large thickness in order to provide a planarized upper surface. The organic insulation material is easier to form the large thickness film compared to the inorganic insulation material. As such, the third insulation film 45 can be formed from an organic insulation material, but is not limited to this.

The thin film transistor overlaps with an organic light-emitting element which will be formed later. As such, the step coverage of the thin film transistor affects the organic light-emitting element. To address this matter, the first embodiment can enable the third insulation film 45 with a planarized surface to be formed on the thin film transistor. In accordance therewith, the organic light-emitting element formed on the third insulation film 45 does not have an affection of the step coverage of the thin film transistor. As a result, pixel faults can be prevented.

As shown in FIG. 1M, a first electrode 49 can be formed in the third contact hole 47 and on the third insulation film 45 around the third contact hole 47.

The first embodiment relates to the top emission type OLED device. As such, the first electrode 40 can be formed from a reflective and conductive material or a reflective metal material in order to reflect light emitted from an organic light emission layer, which will be formed on the first electrode later, in an upward direction. As an example of the first electrode including the reflective and conductive material, a single layer or multiple layers, which is or are formed at least one selected from a material group including Al, Ni, Ag, Rh, Pd, Ir, Ru, Mg, Zn, Pt, Au and Hf, can be employed, but it is not limited to this.

Alternatively, the first electrode 49 can be formed from a transparent conductive material and a reflective layer including a reflective and conductive material can be formed on or under the first electrode 49. However, the first embodiment is not limited to this.

A fourth insulation film 50 can be formed on the third insulation film 45, as shown in FIG. 1N. Also, an opening 58, a bank layer 51 and a spacer 53 can be simultaneously formed. To this end, an exposure process using a half tone mask can be performed for the fourth insulation film 50.

The opening 58 can be prepared on the first electrode 40. In other words, the opening 58 can be formed by removing a portion of the fourth insulation film 50 in order to expose the first electrode 49. A pixel region can be defined by the opening 58.

Such an opening 58 is shown to have a relative small size in FIG. 1N. However, the opening 58 can have a size substantially equal or similar to the pixel region.

The spacer 53 can have a larger thickness than that of the bank layer 51. Such a spacer 53 can be formed or removed as needed. If the substrate 1 is combined with a sealing substrate using a sealant, it is necessary to maintain a gap between the substrate 1 and the sealing substrate. To this end, the spacer 53 can be used. As such, the gap between the substrate 1 and the sealing substrate can be maintained by the spacer 53. In a different manner, a sealing film can be on the substrate 1. In this instance, it is not necessary to use the spacer 53.

An organic light emission layer 55 can be formed on the first electrode 49 within the opening 58. Also, a second electrode 57 can be formed on the organic light emission layer 55.

The first electrode 49, the organic light emission layer 55 and the second electrode 57 can configure an organic light-emitting element 59.

The organic light emission layer 55 can be formed from a highly polymerized organic material or a lowly polymerized organic material. Also, the organic light emission layer 55 can be configured with a plurality of layers. For example, the organic light emission layer can include a hole injection layer, a hole transport layer, a light emission layer, an electron transport layer and an electron injection layer, which are sequentially formed on the first electrode 49. The organic light-emitting element 59 with such a configuration can be driven by a positive voltage applied to the first electrode and a negative or ground voltage applied to the second electrode 57.

Alternatively, the negative voltage can be applied to the first electrode 49 and the positive voltage can be applied to the second electrode 57. In this instance, the organic light emission layer 55 can be formed in an inverse structure to the above-mentioned sequence.

The second electrode 57 can be formed from a transparent conductive material in order to progress light emitted from the organic light emission layer 55 in an upward direction. As an example of the second electrode including the transparent conductive material, a single layer or multiple layers which is or are formed from at least one selected from a material group including ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx and RuOx/ITO. However, the second electrode 57 is not limited to this.

FIGS. 2A through 2M are cross-sectional views illustrating a method of fabricating a top emission type OLED device according to a second embodiment of the invention.

The fabrication method according to the second embodiment is similar to that of the first embodiment. More specifically, FIGS. 2A through 2G, 2I through 2M illustrating the fabrication method according to the second embodiment are the same as FIGS. 1A through 1G and 1J through 1N illustrating that of the first embodiment. In other words, only FIG. 2H included in the fabrication method of the second embodiment is not disclosed in the first embodiment. In view of this point, the fabrication method of the second embodiment will be mainly explained with reference to FIG. 2H. Also, it will be easily understood to an ordinary person explanation regarding FIGS. 2A through 2G and 2I through 2M may rely upon the above-mentioned description for FIGS. 1A through 1G and 1J through 1N illustrating the fabrication method of the first embodiment.

Figure 2A:
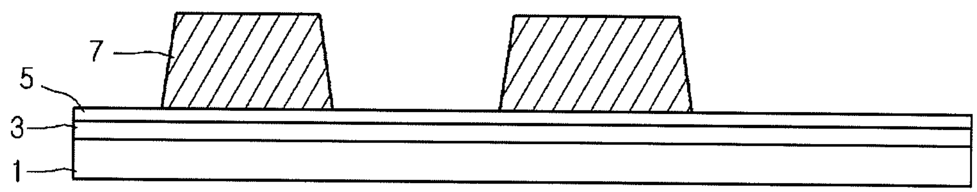
Figure 2B:
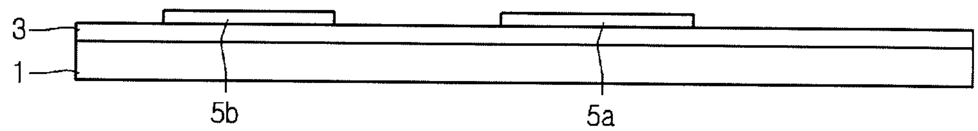
Figure 2F:
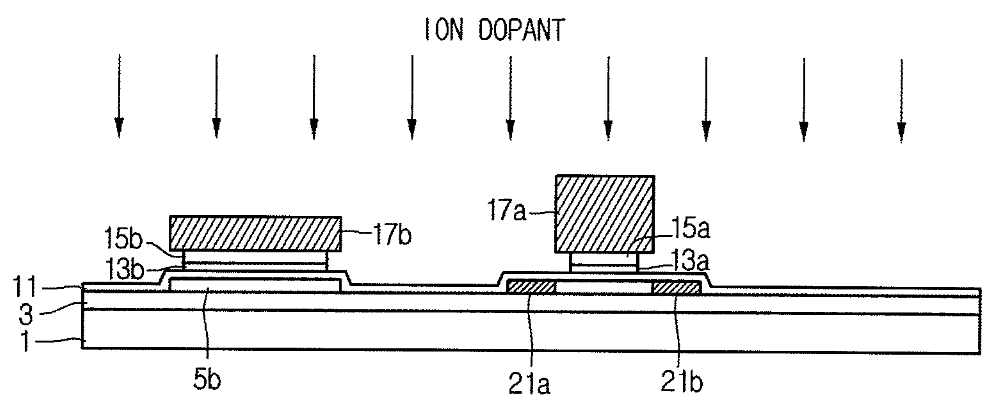
Figure 2G:
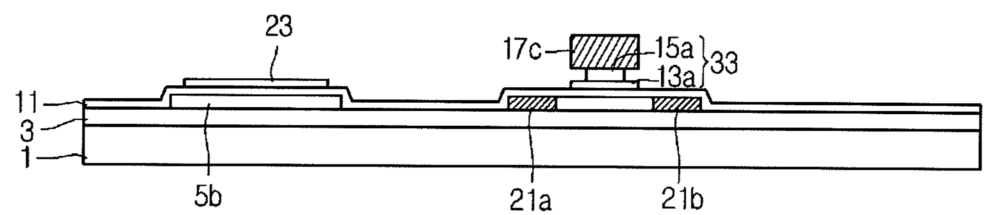

As shown in FIG. 2G, a third photoresist pattern 17*c* can be formed through an ashing process. The width of the third photoresist pattern 17*c* can be narrower than that of the first photoresist pattern 17*a* and the same as that of the first conductive pattern 13*a*.

An over etching process can be performed using the third photoresist pattern 17*c* as a mask, so that the first metal pattern 15*a* has a narrower width than that of the third photoresist pattern 17*c*. Therefore, a gate electrode 33 can be formed by the over etched first metal pattern 15*a* and the conductive pattern 13*a*.

Figure 2H:
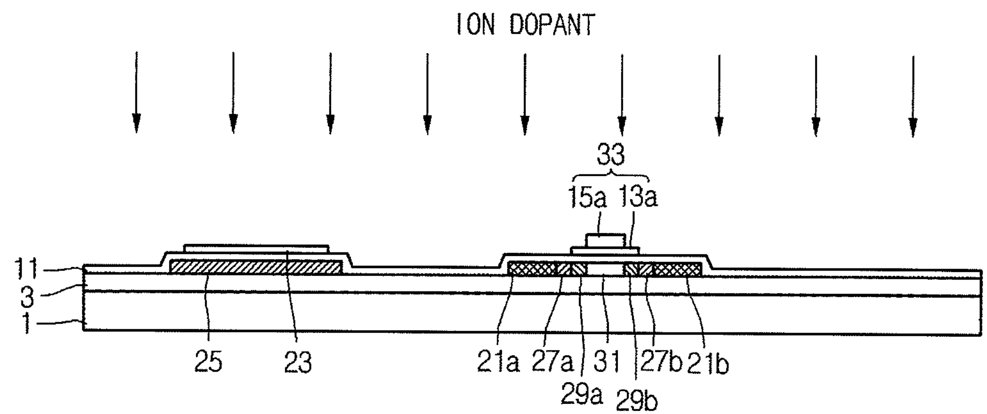
Figure 2I:
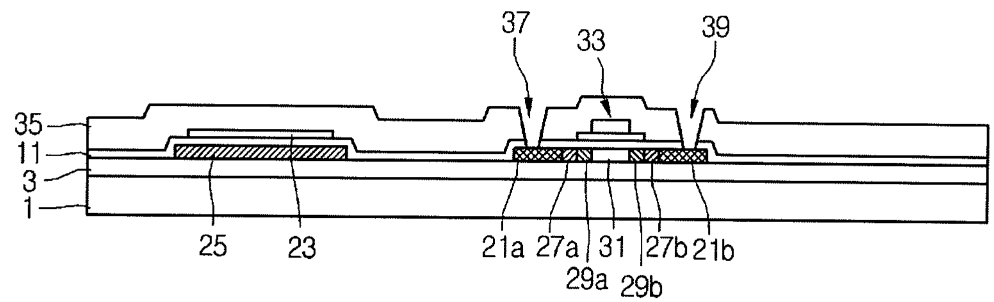
Figure 2J:
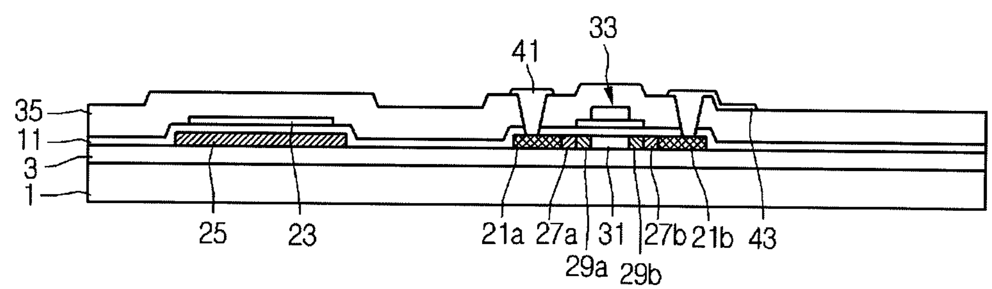
Figure 2K:
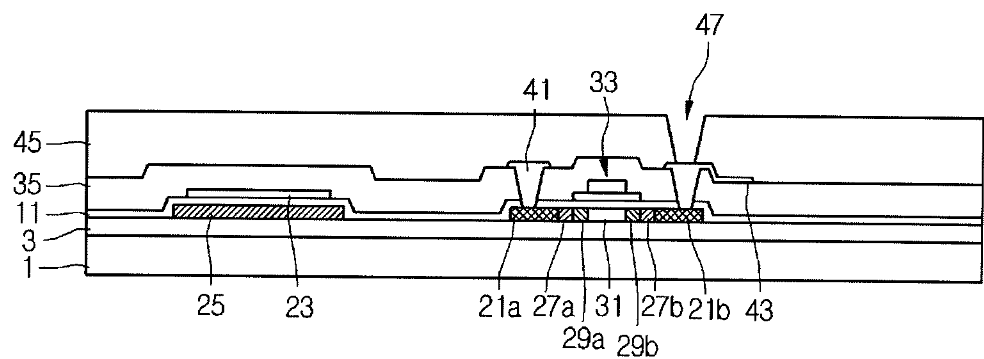
Figure 2L:
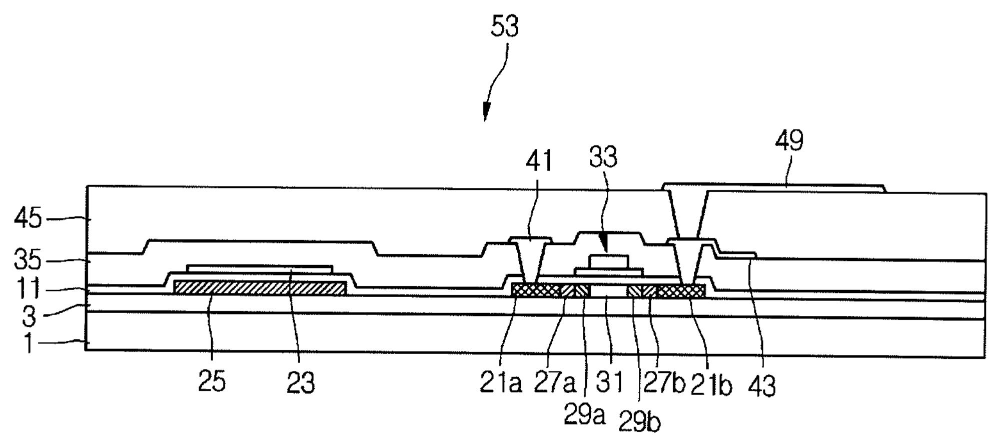
Figure 2M:
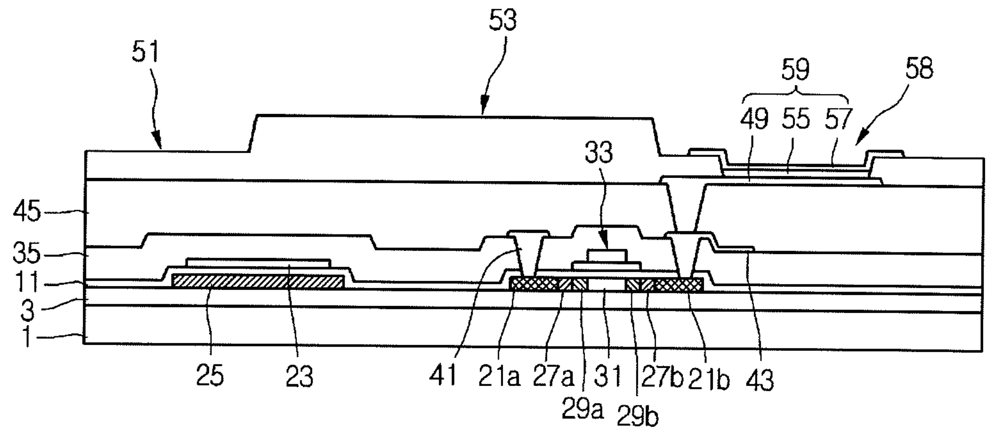

The third photoresist pattern 17*c* can be removed through a stripping process, as shown in FIG. 2H. Subsequently, a second ion injection process can be performed using the first metal pattern 15*a* as a mask.

At this time, the ion dopant can be injected into the first semiconductor pattern 5*a* opposite to side portions of the first conductive pattern 13*a* which are exposed by the first metal pattern 15*a*, thereby forming GOLDD regions 29*a* and 29*b*. At the same time, the ion dopant can be injected into the first semiconductor pattern 5*a* corresponding to side portions of the first photoresist pattern 17*a* which can be exposed by the first conductive pattern 13*a*, thereby forming LDD regions 27*a* and 27*b*.

In this way, the LDD regions 27*a* and 27*b* and the GOLDD regions 29*a* and 29*b* can be simultaneously formed through the same ion injection process. A density difference between the LDD regions 27*a* and 27*b* and the GOLDD regions 29*a* and 29*b* can be adjusted by the conductive pattern 13*a*. This results from the fact that the ion dopant passes through the conductive pattern 13*a* before being injected into the first semiconductor pattern 5*a*. As such, it is relatively easy to inject the ion dopant into the LDD regions 27*a* and 27*b* which are not disturbed by the conductive pattern 13*a*. However, it is relatively difficult to inject the ion dopant into the GOLDD regions 29*a* and 29*b* which are disturbed by the conductive pattern 13*a*. In other words, the dopant density difference between the LDD regions 27*a* and 27*b* and the GOLDD regions 29*a* and 29*b* can be generated according to whether the conductive pattern 13*a* exists or not, even though the same ion injection process is performed. Also, the dopant density difference can be adjusted by controlling the thickness of the conductive pattern 13*a*.

Furthermore, the ion dopant can be injected into the second semiconductor pattern 5*b* after passing through the second capacitor electrode 23, thereby forming a first capacitor electrode 25. Therefore, the first and second capacitor electrodes 25 and 23 together with the first insulation film 11 therebetween can form a capacitor.

The second embodiment can simultaneously form the LDD regions 27*a* and 27*b*, the GOLDD regions 29*a* and 29*b* and the first capacitor electrode 25. Therefore, the second embodiment can reduce the number of masks, compared to a method of individually forming the LDD regions 27*a* and 27*b*, the GOLDD regions 29*a* and 29*b* and the first capacitor electrode 25.

Explanation for the following processes related to FIGS. 2I through 2M will be easily understood to an ordinary person upon reliance of the above-mentioned description for FIGS. 1J through 1N illustrating the fabrication method of the first embodiment.

FIGS. 3A through 3M are cross-sectional views illustrating a method of fabricating a bottom emission type OLED device according to a third embodiment of the invention.

FIGS. 3A through 3K illustrating the fabrication method according to the third embodiment are the same as FIGS. 1A through 1K illustrating that of the first embodiment. As such, it will be easily understood to an ordinary person explanation regarding FIGS. 3A through 3K by relying upon the above-mentioned description for FIGS. 1A through 1K illustrating the fabrication method of the first embodiment. Therefore, description regarding FIGS. 3A through 3K will be omitted.

Figure 3A:
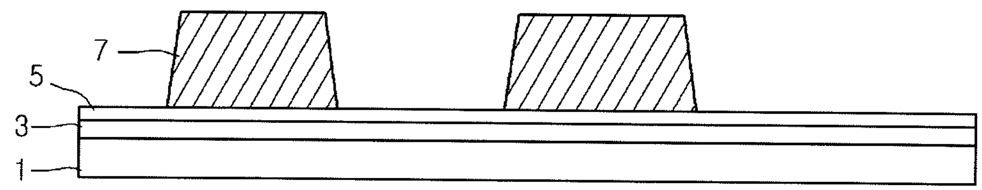
FIGS. 3A through 3M are cross-sectional views illustrating a method of fabricating a bottom emission type OLED device according to a third embodiment of the invention.
Figure 3B:
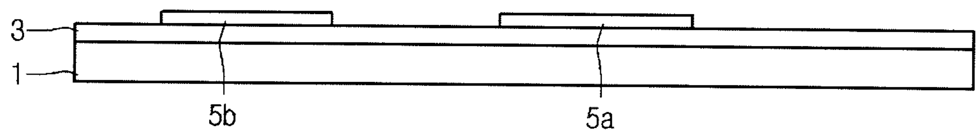
Figure 3C:
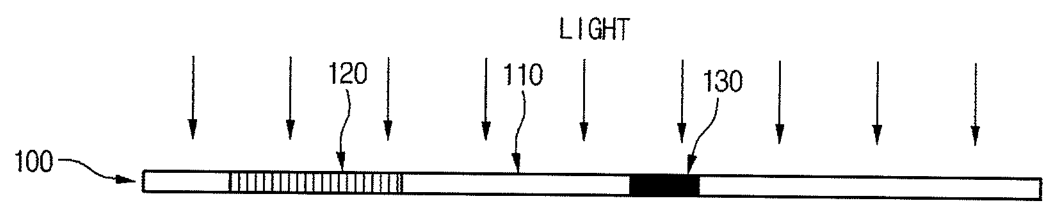
Figure 3D:
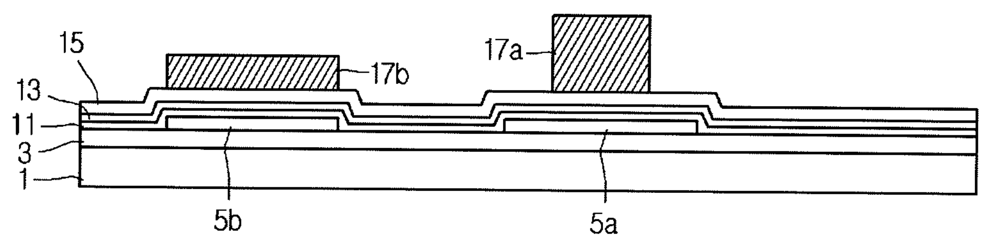
Figure 3E:
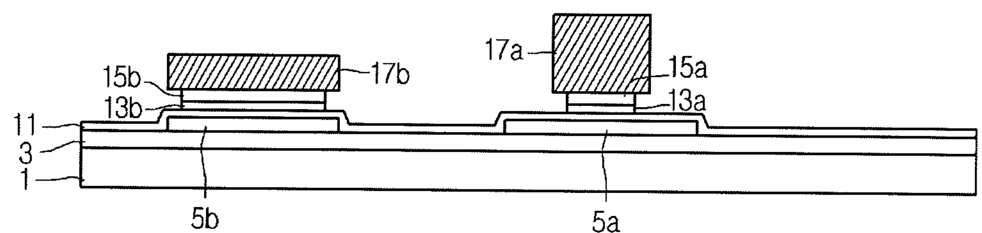
Figure 3F:
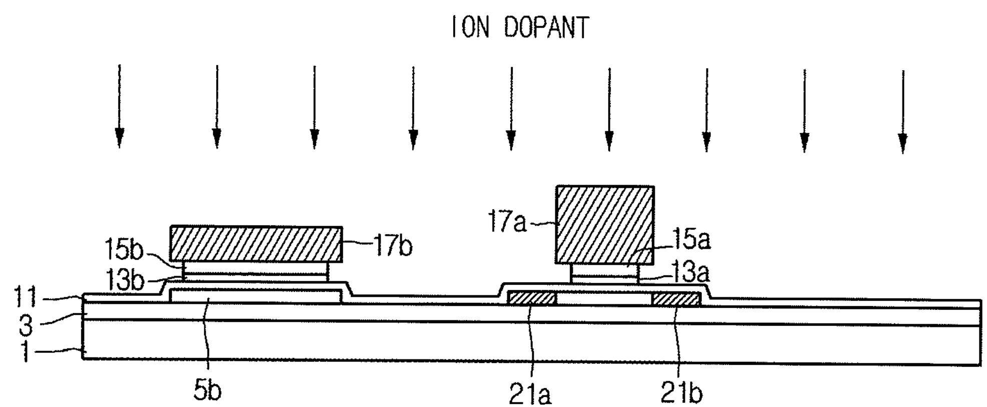
Figure 3G:
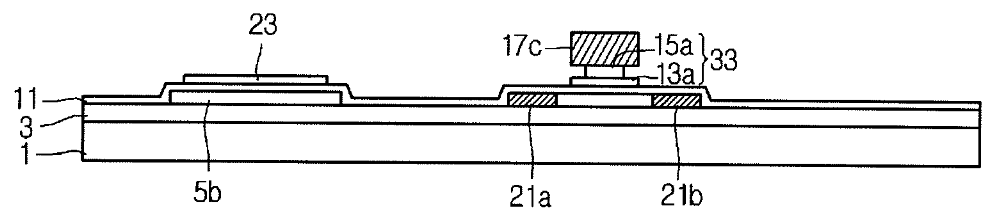
Figure 3H:
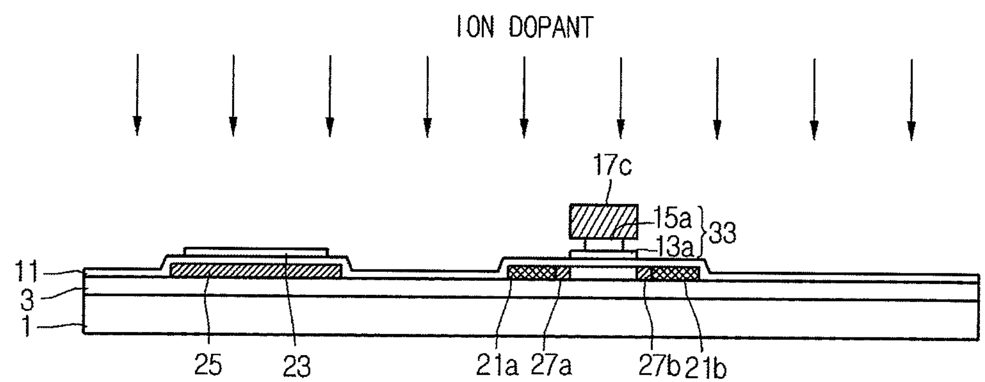
Figure 3I:
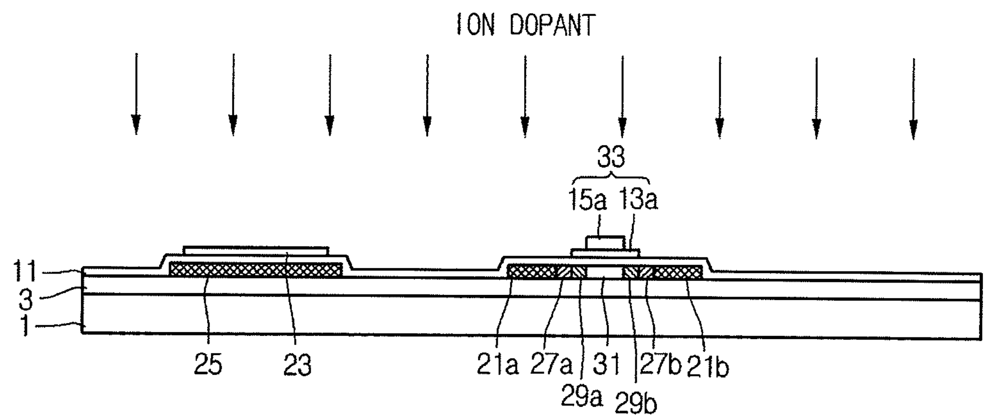
Figure 3J:
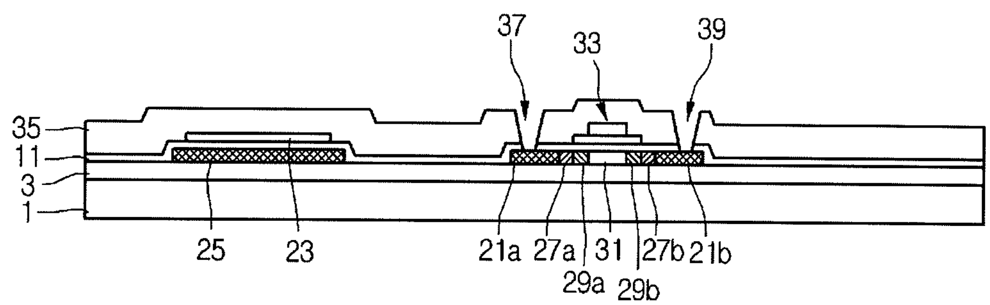
Figure 3K:
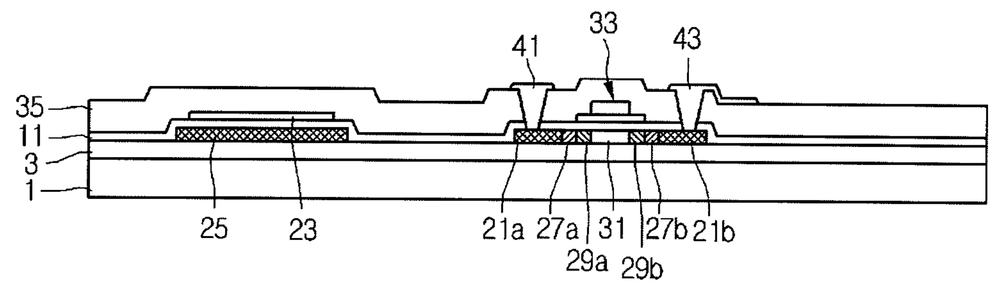

As shown in FIG. 3K, a source electrode 41 can be formed in the first contact hole 37 and on a portion of the second insulation film 35 surrounding the first contact hole 37. Also, a drain electrode 43 can be formed in the second contact hole 39 and on another portion of the second insulation film 35 surrounding the second contact hole 39. The source electrode 41 can be electrically connected to the source region 21*a* of the first semiconductor pattern 5*a* through the first contact hole 37. The drain electrode 43 can be electrically connected to the drain region 21*b* of the first semiconductor pattern 5*a* through the second contact hole 39.

Figure 3L:
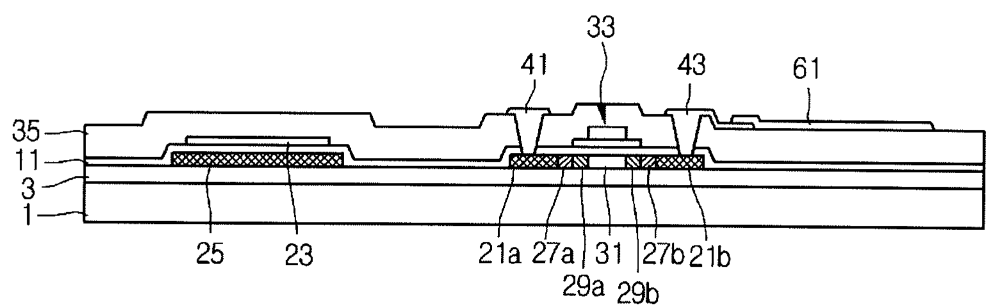

A first electrode 61 can be formed by depositing a conductive film on the second insulation film 35 and patterning the conductive film, as shown in FIG. 3L. The first electrode 61 can be directly and electrically connected to the drain electrode 43. In other words, the first electrode 61 can be formed in contact with upper and side surface of an edge portion of the drain electrode 43. Also, the first electrode 61 can be formed within a pixel region and can come in contact with the upper surface of the second insulation film 35.

The third embodiment relates to the bottom emission type OLED device. As such, the first electrode 61 can be formed from a transparent conductive material, in order to progress light emitted from an organic light emission layer, which will be formed on the first electrode 61 later, in a downward direction. As an example of the first electrode 61 including the transparent conductive material, a single layer or multiple layers which is or are formed from at least one selected from a material group including ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx and RuOx/ITO. However, the first electrode 61 is not limited to this.

Figure 3M:
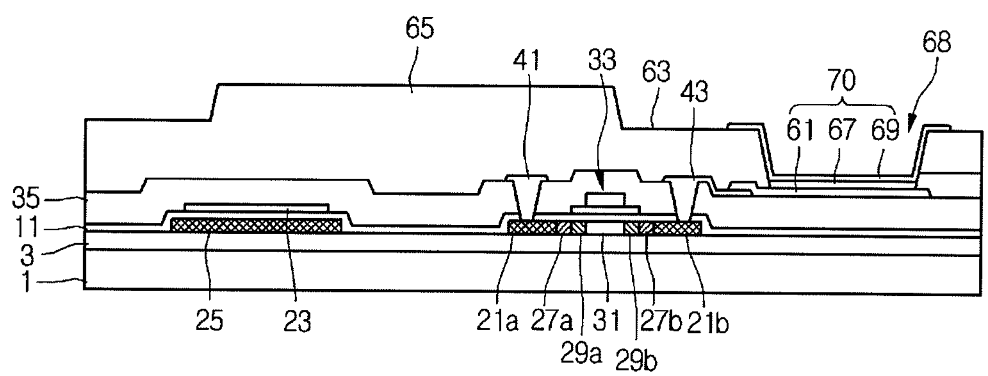

As shown in FIG. 3M, an insulation film 50 can be formed on the entire surface of the above-mentioned substrate 1. Also, an opening 68, a bank layer 63 and a spacer 65 can be simultaneously formed. To this end, an exposure process using a half tone mask can be performed for the insulation film 50.

The opening 68 can be prepared on the first electrode 61. In other words, the opening 68 can be formed by removing a portion of the insulation film 50 in order to expose the first electrode 61. A pixel region can be defined by the opening 68.

The spacer 65 can have a larger thickness than that of the bank layer 63. Such a spacer 65 can be formed or removed as needed.

An organic light emission layer 67 can be formed on the first electrode 61 within the opening 68. Also, a second electrode 69 can be formed on the organic light emission layer 67.

The first electrode 61, the organic light emission layer 67 and the second electrode 69 can form an organic light-emitting element 70.

The second electrode 69 can be formed from a reflective and conductive material or a reflective metal material, in order to reflect light emitted from the organic light emission layer 67 in the downward direction. As an example of the second electrode 69 including the reflective and conductive material, a single layer or multiple layers, which is or are formed at least one selected from a material group including Al, Ni, Ag, Rh, Pd, Ir, Ru, Mg, Zn, Pt, Au and Hf, can be employed, but the second electrode 69 is not limited to this.

The fabrication method of the third embodiment allows not only the third insulation with the planarized surface to be removed but also the first electrode 61 to be directly and electrically connected to the drain electrode 43, unlike those of the first and second embodiments. Therefore, the fabrication method of the third embodiment can reduce more the number of masks compared to those of the first and second embodiments.

FIGS. 4A through 4I are cross-sectional views illustrating a method of fabricating a bottom emission type OLED device according to a fourth embodiment of the invention.

Figure 4A:
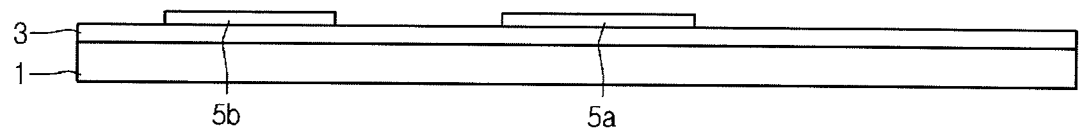

FIG. 4A illustrating the fabrication method according to the fourth embodiment is the same as FIGS. 1A and 1B illustrating that of the first embodiment. Therefore, description regarding FIG. 4A will be omitted.

As shown in FIG. 4B, a first insulation film 11 can be formed on the entire surface of the above-mentioned substrate 1. Also, a conductive film 13 and a metal film 15 can be sequentially formed on the first insulation film 11. Furthermore, a photoresist film 17 can be formed on the metal film 15 before a half tone mask 200 is disposed over the photoresist film 17.

The half tone mask 200 used in the fourth embodiment is different from the half tone mask 100 shown in FIG. 3C. More specifically, the half tone mask 200 can include semi-transmission regions 220 opposite to regions of the substrate 1 in which the first capacitor electrode and a first electrode will be formed. Also, the half tone mask 200 can have an interception region 230 opposite to another region of the substrate 1 in which a semiconductor pattern (i.e., an active region) of the thin film transistor will be formed.

An exposure process can be performed for the half tone mask 200 before performing a development process for the photoresist film. In accordance therewith, first and second photoresist patterns 17*a* and 17*b* can be derived from the photoresist film 17, as shown FIG. 4C.

The first photoresist pattern 17*a* can be formed opposite the interception region 230 of the half tone mask 200. The second photoresist patterns 17*b* can be formed opposite the semi-transmission regions 220 of the half tone mask 200.

The width of the first photoresist pattern 17*a* is narrower than that of the first semiconductor pattern 5*a*. As such, any photoresist pattern does not exist on both side edges of the first semiconductor pattern 5*a* which are exposed by the first photoresist pattern 17*a*.

As shown in FIG. 4D, an etch process using the first and second photoresist patterns 17*a* and 17*b* as a mask can be performed.

Through the etch process, first, the metal film 15 can be selectively removed. In accordance therewith, a first metal pattern 15*a* can be formed under the first photoresist pattern 17*a*, and second and third metal patterns 15*b* and 15*c* can be respectively formed under the second photoresist patterns 17*b*.

Subsequently, the conductive film 13 can be selectively removed, thereby forming first through third conductive patterns 13*a* through 13*c*. The first conductive pattern 13*a* can be formed under the first metal pattern 15*a*. The second and third conductive patterns 13*b* and 13*c* can be formed under the second and third metal patterns 15*b* and 15*c*, respectively.

The metal film 15 and the conductive film 13 can be over etched, so that the first through third metal patterns 15*a*, 15*b* and 15*c* and the first through third conductive patterns 13*a*, 13*b* and 13*c* have narrower widths than those of the first and second photoresist patterns 17*a* and 17*b*. As such, it is possible to inject ions into the first semiconductor pattern 5*a* opposite to both side edges of the first photoresist pattern 17*a*, which are exposed by the first conductive pattern 13*a*, later. The detailed explanation for this will be made later.

Also, an ion injection process can be first performed using the first and second photoresist patterns 17*a* and 17*b* as a mask.

At this time, an ion dopant is injected into both side edges of the first semiconductor pattern 5*a* not covered with the first photoresist pattern 17*a*, i.e., both side portions of the first semiconductor pattern 5*a* exposed by the first photoresist pattern 17*a*. In accordance therewith, a source region 21*a* and a drain region 21*b* can be formed.

Figure 4E:
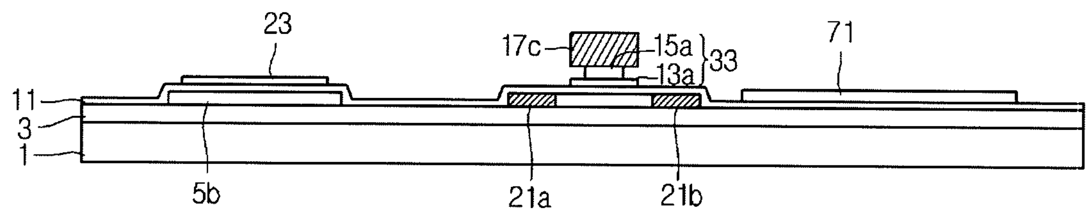

As shown in FIG. 4E, an ashing process can be performed for the first and second photoresist patterns 17*a* and 17*b*. Such an ashing process can decrease the thicknesses or the widths of the first and second photoresist patterns 17*a* and 17*b*. The ashing process can proceed until the second photoresist pattern 17*b* is completely removed. Although the second photoresist patterns 17*b* are completely removed, the first photoresist pattern 17*a* is not removed. This results from the fact that the thickness of the first photoresist pattern 17*a* is larger than those of the second photoresist patterns 17*b*. As such, when the second photoresist patterns 17*b* are removed, the first photoresist pattern 17*a* can be reformed in a third photoresist pattern 17*c* with a thickness and a width which decrease by the thickness of the second photoresist patterns 17*b*.

The third photoresist pattern 17*c* can have a size or a width substantially equal to that of the first conductive pattern 13*a*. As such, it is possible to inject ions into the first semiconductor pattern 5*a* corresponding to the rim portion or side portions of the first photoresist pattern 17*a* which can be exposed by the first conductive pattern 13*a*.

An etch process can be performed using the third photoresist pattern 17*c* as a mask. At this time, an over etch for removing edge portions of the first metal pattern 15*a* can be performed. In accordance therewith, the first metal pattern 15*a* can have a smaller size or a narrower width than that of the first conductive pattern 13*a*. As such, it is possible to inject ions into the first semiconductor pattern 5*a* corresponding to both side portions of the third photoresist pattern 17*c* which can be exposed by the first metal pattern 15*a*.

The over etched first metal pattern 15*a* and the first conductive pattern 13*a* can be used as a gate electrode 33.

Through the above-mentioned etch process, the second metal patterns 15*b* is removed so that only the second conductive pattern 13*b* remains. The second conductive pattern 13*b* can become a second capacitor electrode 23.

Also, the third metal pattern 15*c* on the third conductive pattern 13*c* is removed through the above-mentioned etch process, so that the third conductive pattern 13*c* can be exposed. The exposed third conductive pattern 13*c* can become a first electrode 71.

Figure 4F:
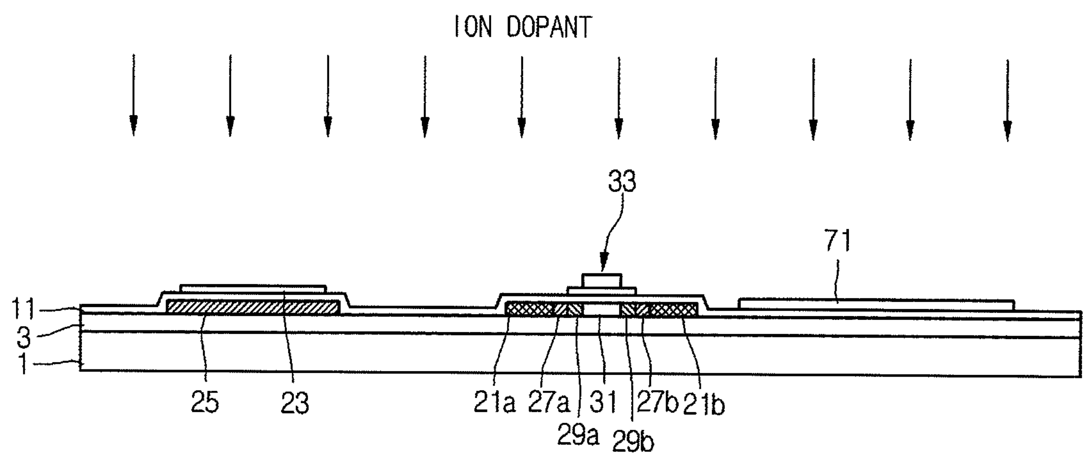

The third photoresist pattern 17*c* can be removed through a stripping process, as shown in FIG. 4F. Subsequently, a second ion injection process can be performed using the first metal pattern 15*a* as a mask.

At this time, the ion dopant can be injected into the first semiconductor pattern 5*a* opposite to both side portions of the first conductive pattern 13*a* which are exposed by the first metal pattern 15*a*, thereby forming GOLDD regions 29*a* and 29*b*. At the same time, the ion dopant can be injected into the first semiconductor pattern 5*a* corresponding to both side portions of the first photoresist pattern 17*a* which can be exposed by the first conductive pattern 13*a*, thereby forming LDD regions 27*a* and 27*b*.

Furthermore, the ion dopant can be injected into the second semiconductor pattern 5*b* after passing through the second capacitor electrode 23, thereby forming a first capacitor electrode 25. Therefore, the first and second capacitor electrodes 25 and 23 together with the first insulation film 11 therebetween can form a capacitor.

The fourth embodiment can simultaneously form the LDD regions 27*a* and 27*b*, the GOLDD regions 29*a* and 29*b* and the first capacitor electrode 25. Therefore, the fourth embodiment can reduce the number of masks, compared to a method of individually forming the LDD regions 27*a* and 27*b*, the GOLDD regions 29*a* and 29*b* and the first capacitor electrode 25.

Figure 4G:
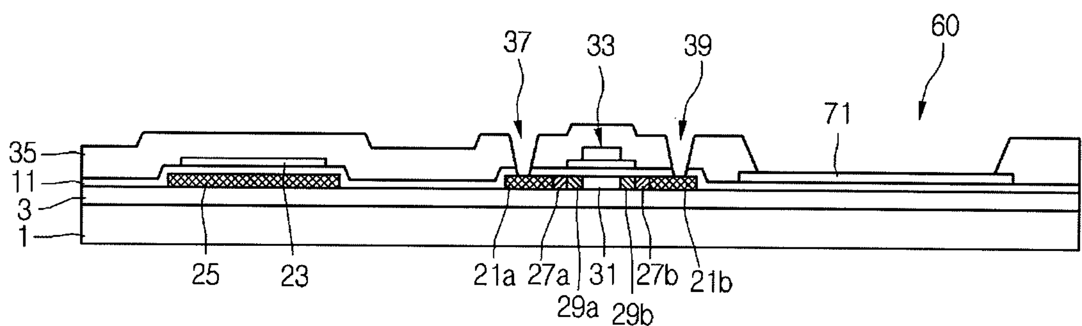

As shown in FIG. 4G, a second insulation film 35 can be formed on the gate electrode 33, the second capacitor electrode 23 and the first insulation film 11. Then, first and second contact holes 37 and 39 (or first and second through holes) and a first opening 60 can be formed in the second insulation film 35.

The first contact hole 37 exposes a part of the source region 21*a*. The second contact hole 39 exposes a part of the drain region 21*b*. The first opening 60 can exposes the first electrode 71.

Figure 4H:
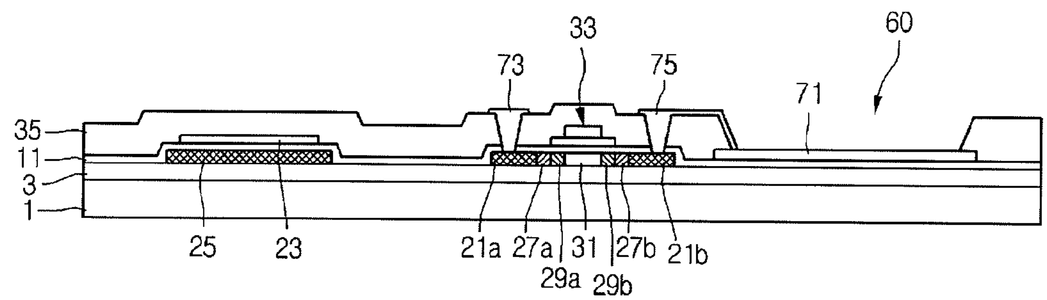

As shown in FIG. 4H, a source electrode 73 can be formed in the first contact hole 37 and on a portion of the second insulation film 35 surrounding the first contact hole 37. Also, a drain electrode 75 can be formed in the second contact hole 39 and on another portion of the second insulation film 35 surrounding the second contact hole 39. The source electrode 73 can be electrically connected to the source region 21*a* of the first semiconductor pattern 5*a* through the first contact hole 37. The drain electrode 75 can be electrically connected to the drain region 21*b* of the first semiconductor pattern 5*a* through the second contact hole 39. Also, the drain electrode 75 can be electrically connected to the first electrode 71 through the first opening 60. In other words, the drain electrode 75 can be electrically connected from the drain region 21*b* to the first electrode 71 via an upper surface of the second insulation film 35 and an inner side surface of the first opening 60.

A thin film transistor can be configured with the above-mentioned semiconductor pattern, the gate electrode 33, the source electrode 73 and the drain electrode 75.

Figure 4I:
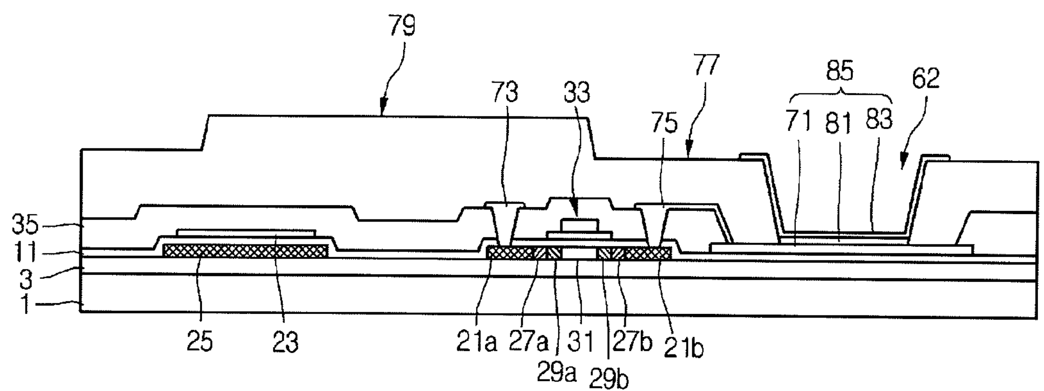

An insulation film can be formed on the second insulation film 35, as shown in FIG. 4I. Also, a second opening 62, a bank layer 77 and a spacer 79 can be simultaneously formed by performing an exposure process, which uses a half tone mask, for the insulation film.

The second opening 62 can be prepared on the first electrode 71. The second opening 62 can be defined by the insulation film which is formed within the first opening 60. The size and width of the second opening 62 can be smaller than those of the first opening 60 because of the insulation film formed within the first opening 60. Such a second opening 62 can be formed by removing the insulation film until the first electrode 71 is exposed. A pixel region can be defined by the second opening 62.

The spacer 79 can have a larger thickness than that of the bank layer 77. Such a spacer 79 can be formed or removed as needed.

An organic light emission layer 81 can be formed on the first electrode 71 within the second opening 62. Also, a second electrode 83 can be formed on the organic light emission layer 81.

The first electrode 71, the organic light emission layer 81 and the second electrode 83 can form an organic light-emitting element 85.

The second electrode 83 can be formed from a reflective and conductive material or a reflective metal material, in order to reflect light emitted from the organic light emission layer 81 in the downward direction. As an example of the second electrode 83 including the reflective and conductive material, a single layer or multiple layers, which is or are formed at least one selected from a material group including Al, Ni, Ag, Rh, Pd, Ir, Ru, Mg, Zn, Pt, Au and Hf, can be employed, but the second electrode 83 is not limited to this.

FIGS. 5A through 5I are cross-sectional views illustrating a method of fabricating a bottom emission type OLED device according to a fifth embodiment of the invention.

The fabrication method of the fifth embodiment is similar to that of the fourth embodiment. Only, the fifth embodiment is different from the fourth embodiment in that a double layer of a metal pattern and a conductive pattern is formed in an opening or a pixel region before a first electrode is derived from the conductive pattern, and a part of the metal pattern is reformed in a connection electrode by partially removing the metal pattern at the formation of a drain electrode.

Figure 5A:
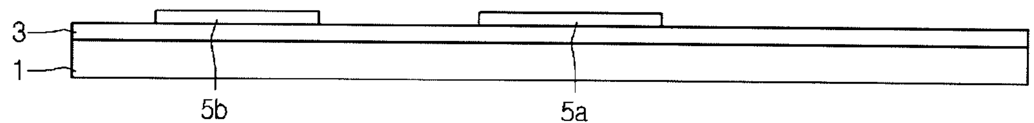
FIGS. 5A through 5I are cross-sectional views illustrating a method of fabricating a bottom emission type OLED device according to a fifth embodiment of the invention.

As shown in FIG. 5A, a buffer layer 3 can be formed on a substrate 1. Also, first and second semiconductor patterns 5*a* and 5*b* can be formed on the buffer layer 3. The first and second semiconductor patterns 5*a* and 5*b* can prepared by forming a semiconductor material film on the buffer layer 3, crystallizing the semiconductor material film through a crystallizing process, and patterning the crystallized semiconductor material film.

Figure 5B:
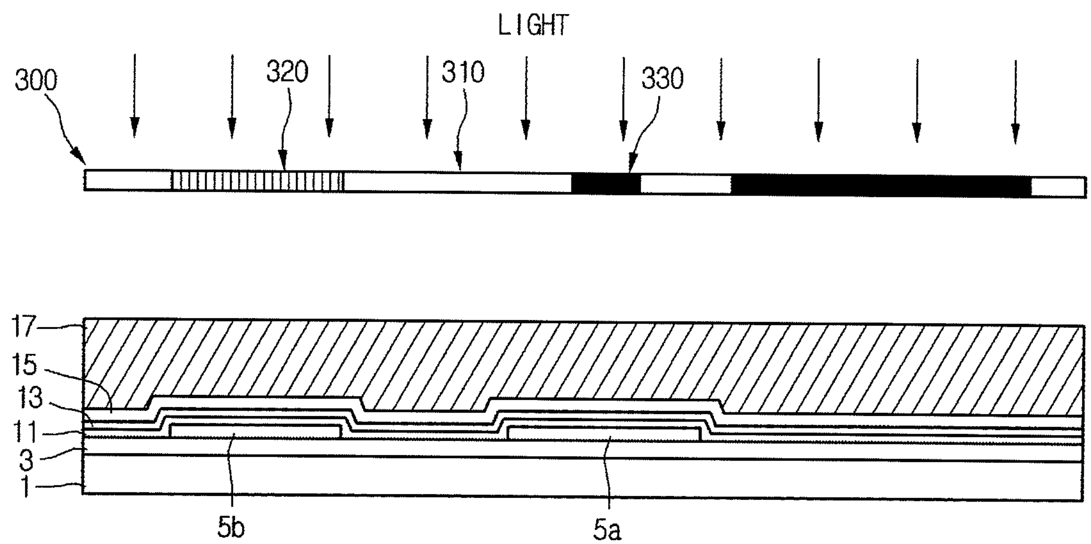
Figure 5C:
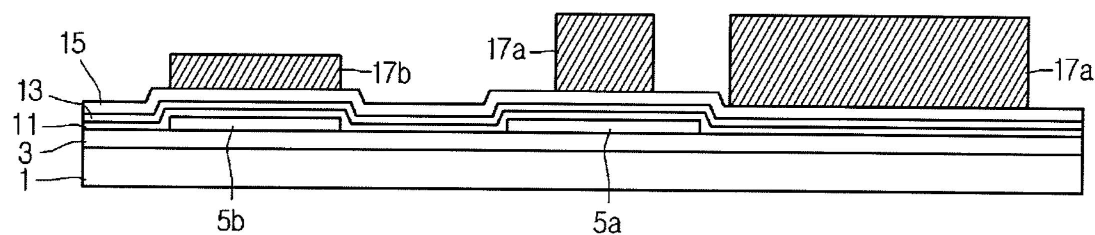

A first insulation film 11 can be formed on the entire surface of the above-mentioned substrate 1, as shown in FIG. 5B. Also, a first conductive film 13, a first metal film 15 and a photoresist film 17 can be sequentially formed on the first insulation film 11. Furthermore, a half tone mask 300 is disposed over the photoresist film 17.

The half tone mask 300 can include a semi-transmission region 320 and two interception regions 330, unlike the half tone mask 200 which is shown in FIG. 4B illustrating the fourth embodiment. More specifically, the half tone mask 200 of FIG. 4B includes semi-transmission regions 220 opposite to a region of the substrate 1 in which a first electrode will be formed later. However, the half tone mask 300 of FIG. 5B can include an interception region 330 opposite to a region of the substrate 1 in which a first electrode will be formed later.

An exposure process can be performed for the half tone mask 300 before performing a development process for the photoresist film. In accordance therewith, first and second photoresist patterns 17*a* and 17*b* can be derived from the photoresist film 17, as shown FIG. 5C.

The first photoresist patterns 17*a* can be formed opposite the interception regions 330 of the half tone mask 300. The second photoresist pattern 17*b* can be formed opposite the semi-transmission regions 320 of the half tone mask 300.

The first photoresist patterns 17*a* can be formed on a first region of the substrate 1, in which a thin film transistor will be formed later, and a second region of the substrate 1 in which a first electrode will be formed later. The second photoresist pattern 17*a* can be formed on a third region of the substrate 1 in which a first capacitor electrode will be formed.

The width of the first photoresist pattern 17*a* on the first region of the substrate 1 is narrower than that of the first semiconductor pattern 5*a*. As such, any photoresist pattern does not exist on both side edges of the first semiconductor pattern 5*a* which are exposed by the first photoresist pattern 17*a*.

An etch process using the first and second photoresist patterns 17*a* and 17*b* as a mask can be performed.

Figure 5D:
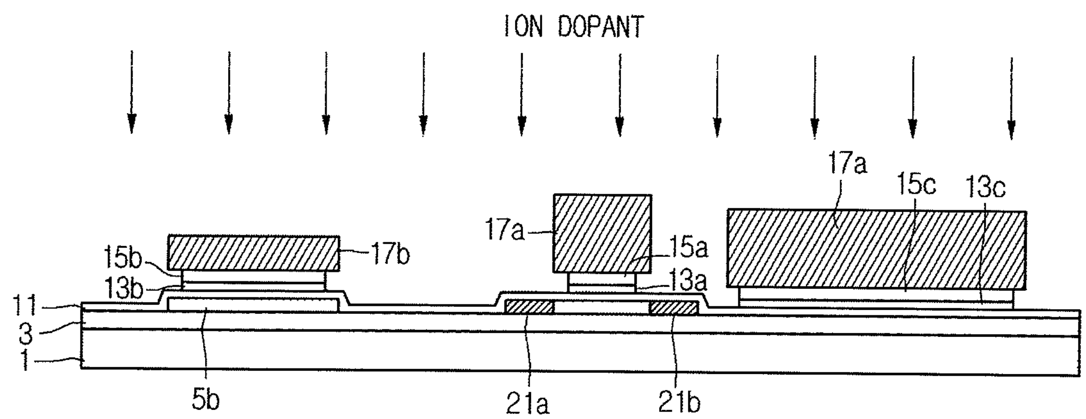

Through the etch process, first, the metal film 15 can be selectively removed. In accordance therewith, first and third metal patterns 15*a* and 15*c* can be respectively formed under the first photoresist patterns 17*a*, and second metal pattern 15*b* can be formed under the second photoresist patterns 17*b*, as shown in FIG. 5D.

Subsequently, the conductive film 13 can be selectively removed, thereby forming first through third conductive patterns 13*a* through 13*c*. The first and third conductive patterns 13*a* and 13*c* can be formed under the first and third metal pattern 15*a* and 15*c*, respectively. The second conductive pattern 13*b* can be formed under the second metal pattern 15*b*.

The first through third metal patterns 15*a*, 15*b* and 15*c* and the first through third conductive patterns 13*a*, 13*b* and 13*c* have narrower widths than those of the first and second photoresist patterns 17*a* and 17*b*. To this end, the metal film 15 and the conductive film 13 can be over etched.

Also, an ion injection process can be first performed using the first and second photoresist patterns 17*a* and 17*b* as a mask.

At this time, an ion dopant is injected into both side edges of the first semiconductor pattern 5*a* not covered with the first photoresist pattern 17*a*, i.e., both side portions of the first semiconductor pattern 5*a* exposed by the first photoresist pattern 17*a*. In accordance therewith, a source region 21*a* and a drain region 21*b* can be formed.

Figure 5E:
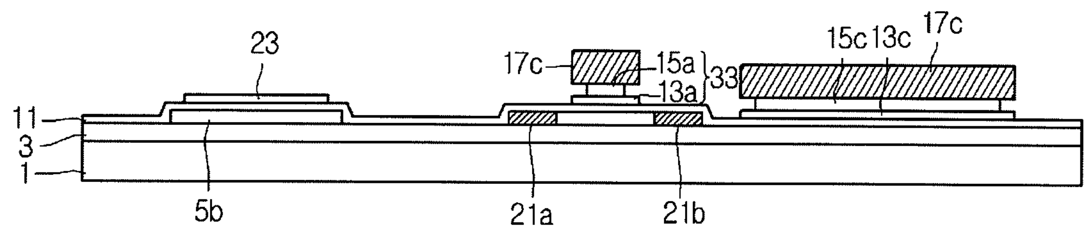

An ashing process can be performed for the first and second photoresist patterns 17*a* and 17*b* as shown in FIG. 5E. Such an ashing process can decrease the thicknesses or the widths of the first and second photoresist patterns 17*a* and 17*b*. The ashing process can proceed until the second photoresist pattern 17*b* is completely removed. Although the second photoresist pattern 17*b* is completely removed, the first photoresist patterns 17*a* are not removed. This results from the fact that the thicknesses of the first photoresist patterns 17*a* are larger than that of the second photoresist pattern 17*b*. As such, when the second photoresist pattern 17*b* is removed, the first photoresist patterns 17*a* can be reformed in third photoresist patterns 17*c* with thicknesses and widths which decrease by the thickness of the second photoresist pattern 17*b*.

The third photoresist patterns 17*c* can be formed on the first and third regions of the substrate 1.

The third photoresist pattern 17*c* on the first region of the substrate 1 can have a size or a width substantially equal to that of the first conductive pattern 13*a*. As such, it is possible to inject ions into the first semiconductor pattern 5*a* corresponding to both side portions of the first photoresist pattern 17*a* which can be exposed by the first conductive pattern 13*a*.

An etch process can be performed using the third photoresist patterns 17*c* as a mask. At this time, an over etch for removing edge portions of the first metal pattern 15*a* can be performed. In accordance therewith, the first metal pattern 15*a* can have a smaller size or a narrower width than that of the first conductive pattern 13*a*. As such, it is possible to inject ions into the first semiconductor pattern 5*a* corresponding to both side portions of the third photoresist pattern 17*c* which can be exposed by the first metal pattern 15*a*.

The over etched first metal pattern 15*a* and the first conductive pattern 13*a* can be used as a gate electrode 33.

Through the above-mentioned etch process, the second metal patterns 15*b* is removed so that only the second conductive pattern 13*b* remains. The second conductive pattern 13*b* can become a second capacitor electrode 23.

Figure 5F:
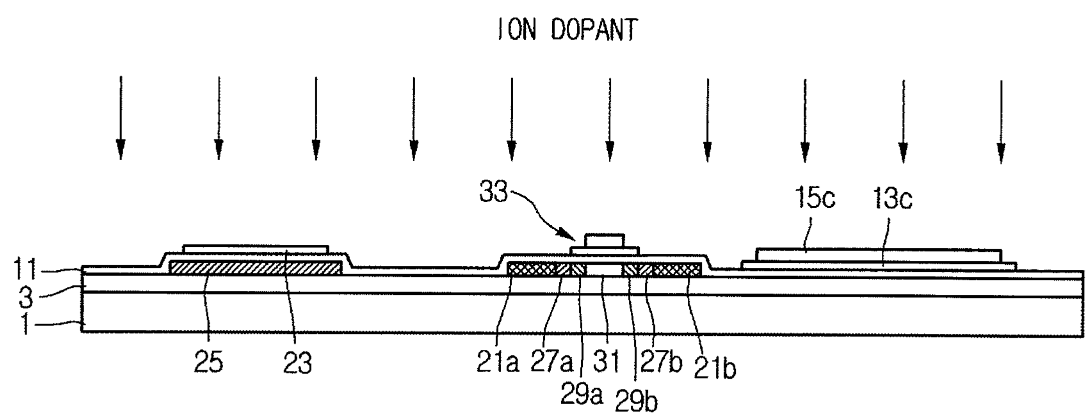

The third photoresist pattern 17*c* can be removed through a stripping process, as shown in FIG. 5F.

In accordance therewith, a gate electrode 33 including the first conductive pattern 13*a* and the first metal pattern 15*a* can be formed on the first region of the substrate 1. Also, a second capacitor electrode 23 can be formed of the second conductive pattern on the second region of the substrate 1. Furthermore, a double layer structure of the third conductive and metal patterns 13*c* and 15*c* can be formed on the third region of the substrate 1.

Subsequently, a second ion injection process can be performed using the first metal pattern 15*a* as a mask.

At this time, the ion dopant can be injected into the first semiconductor pattern 5*a* opposite to both side portions of the first conductive pattern 13*a* which are exposed by the first metal pattern 15*a*, thereby forming GOLDD regions 29*a* and 29*b*. At the same time, the ion dopant can also be injected into the first semiconductor pattern 5*a* corresponding to both side portions of the first photoresist pattern 17*a* which can be exposed by the first conductive pattern 13*a*, thereby forming LDD regions 27*a* and 27*b*.

Furthermore, the ion dopant can be injected into the second semiconductor pattern 5*b* after passing through the second capacitor electrode 23, thereby forming a first capacitor electrode 25. Therefore, the first and second capacitor electrodes 25 and 23 together with the first insulation film 11 therebetween can form a capacitor.

The fifth embodiment can simultaneously form the GOLDD regions 29*a* and 29*b*, the LDD regions 27*a* and 27*b* and the first capacitor electrode 25. Therefore, the fifth embodiment can reduce the number of masks, compared to a method of individually forming the LDD regions 27*a* and 27*b*, the GOLDD regions 29*a* and 29*b* and the first capacitor electrode 25.

Figure 5G:
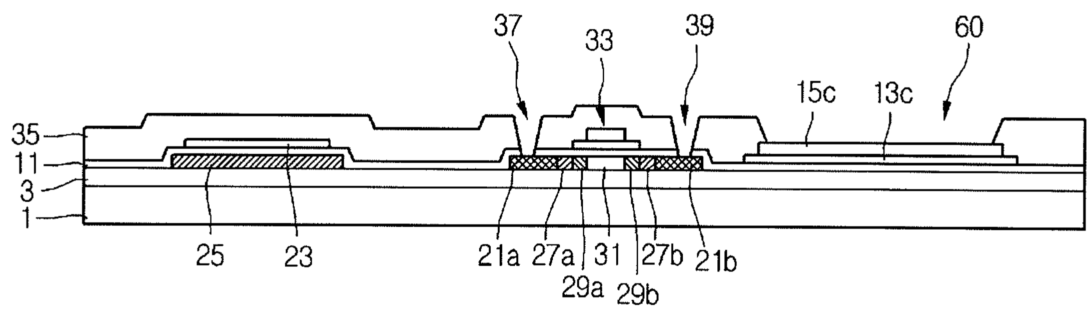

As shown in FIG. 5G, a second insulation film 35 can be formed on the gate electrode 33, the second capacitor electrode 23 and the first insulation film 11. Then, first and second contact holes 37 and 39 (or first and second through holes) and a first opening 60 can be formed in the second insulation film 35.

The second insulation film 35 formed within the first opening 60 can be overlapped with at least an upper surface of the edge portion of the third metal pattern 15*c*. The first contact hole 37 exposes a part of the source region 21*a*. The second contact hole 39 exposes a part of the drain region 21*b*. The first opening 60 can exposes the third metal pattern 15*c*.

Figure 5H:
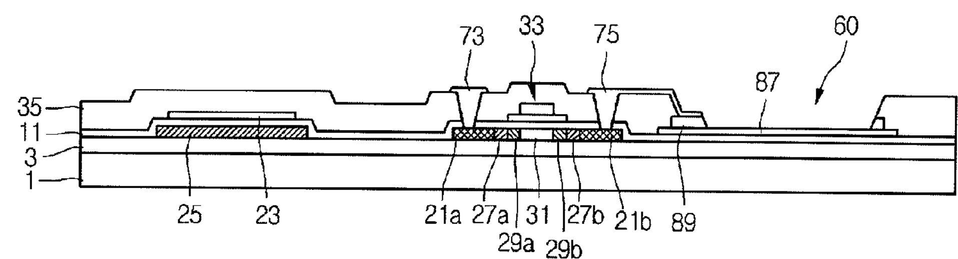

As shown in FIG. 5H, a source electrode 73 can be formed in the first contact hole 37 and on a portion of the second insulation film 35 surrounding the first contact hole 37. Also, a drain electrode 75 can be formed in the second contact hole 39 and on another portion of the second insulation film 35 surrounding the second contact hole 39.

When the source and drain electrodes 73 and 75 are formed, the third metal pattern 15*c* can be selectively removed and reformed in a connection electrode 89. In other words, the residual of the third metal pattern 15*c* not removed can become the connection electrode 89. The third conductive pattern 13*c* can become a first electrode 87. The connection electrode 89 can overlap with at least the second insulation film 35 and the drain electrode 75 which are formed within the first opening 60.

The source electrode 73 can be electrically connected to the source region 21*a* of the first semiconductor pattern 5*a* through the first contact hole 37. The drain electrode 75 can be electrically connected to the drain region 21*b* of the first semiconductor pattern 5*a* through the second contact hole 39. Also, the drain electrode 75 can be electrically connected to the connection electrode 89 through the first opening 60. In other words, the drain electrode 75 can be electrically connected from the drain region 21*b* to the connection electrode 89 via an upper surface of the second insulation film 35 and an inner side surface of the first opening 60. The connection electrode 89 can be electrically connected to the first electrode 87.

A thin film transistor can be configured with the above-mentioned semiconductor pattern, the gate electrode 33, the source electrode 73 and the drain electrode 75.

Figure 5I:
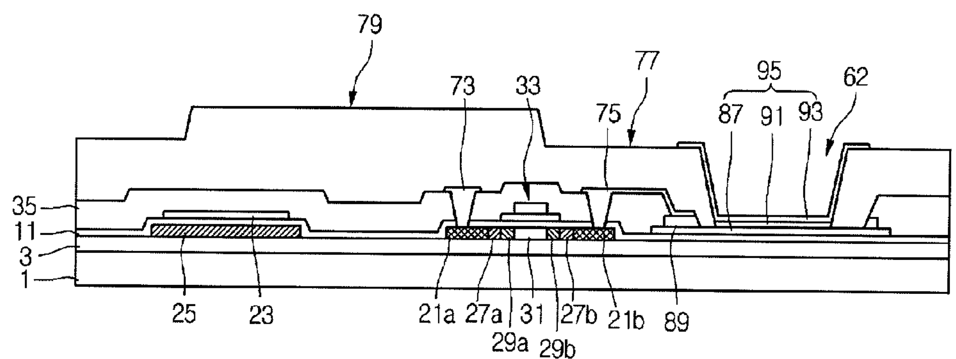

An insulation film 50 can be formed on the second insulation film 35, as shown in FIG. 5I. Also, a second opening 62, a bank layer 77 and a spacer 79 can be simultaneously formed by performing an exposure process, which uses a half tone mask, for the insulation film 50.

The second opening 62 can be prepared on the first electrode 87. The second opening 62 can be defined by the insulation film which is formed within the first opening 60. The size and width of the second opening 62 can be smaller than those of the first opening 60 because of the insulation film formed within the first opening 60. The spacer 79 can be formed or removed as needed.

An organic light emission layer 91 can be formed on the first electrode 87 within the second opening 62. Also, a second electrode 93 can be formed on the organic light emission layer 91. The first electrode 87, the organic light emission layer 91 and the second electrode 93 can configure an organic light-emitting element 95.

The second electrode 93 can be formed from a reflective and conductive material, in order to reflect light emitted from the organic light emission layer 91 in the downward direction.

Some content abridged and omitted from the explanations of the second through fifth embodiments can be supported by the description of the first embodiment and can be easily understood to the ordinary person upon the description and drawings regarding the first embodiment.

Figure 6A:
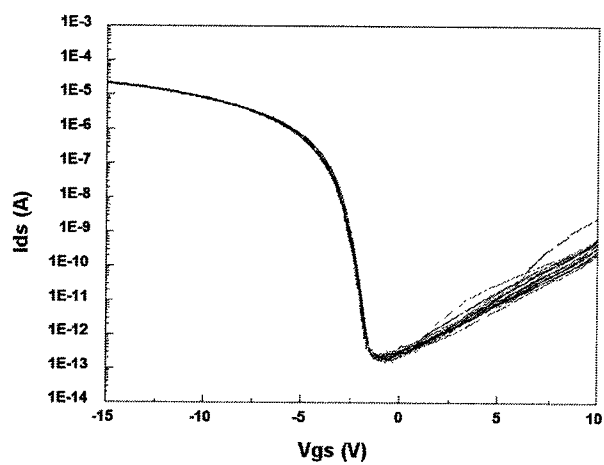
FIGS. 6A and 6B are data sheets comparing current-voltage characteristics of thin film transistors according to an embodiment of the invention and a related art.
Figure 6B:
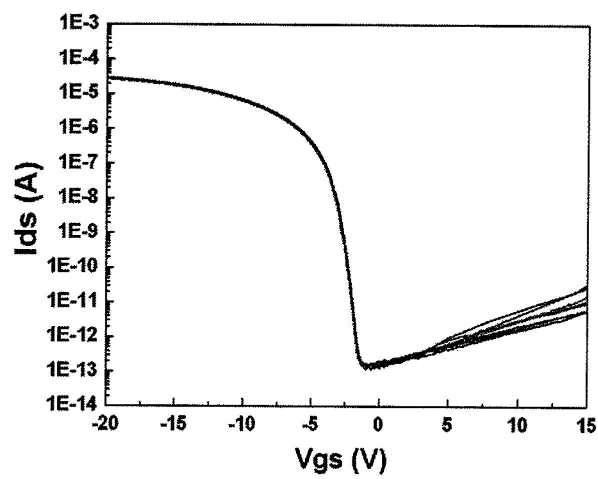

FIGS. 6A and 6B are data sheets comparing current-voltage characteristics of thin film transistors according to an embodiment of the invention and a related art.

FIG. 6A illustrates a current-voltage characteristic regarding a thin film transistor of the related art OLED device without an LDD region and a GOLDD region. FIG. 6B illustrates a current-voltage characteristic regarding a thin film transistor of the OLED device according an embodiment of the invention with an LDD region and a GOLDD region.

As shown in FIG. 6A, the thin film transistor of the related art enables an off current to steeply increase a voltage range of 0~10V. Meanwhile, an off current of the thin film transistor of the embodiment of the invention gently increases in the voltage range of 0~10V, as shown in FIG. 6B.

For example, according to data obtained from experiments, the off current of the thin film transistor of the related art is 2.2 pA, but the thin film transistor according to an embodiment of the invention has only an off current of 0.7 pA. Moreover, the threshold voltage Vth of the thin film transistor of the related art is −3.00V, but the thin film transistor according to an embodiment of the invention has a threshold voltage Vth of −2.69V. Therefore, it is evident that the thin film transistor according to an embodiment of the invention has a superior off current characteristic compared to that of the related art.

In this manner, the fabrication methods according to embodiments of the invention can enhance electrical characteristics and reduce the number of masks, compared to that of the related art. Therefore, the fabrication methods according to embodiments of the invention can not only reduce fabrication time and fabrication cost, but also enhance production efficiency.

According to a sixth embodiment of the invention, a bottom emission type OLED device is fabricated by combining the process of making a thin film transistor according to the second embodiment of the invention and the process of making an organic light-emitting element 59 according to the third embodiment of the invention.

According to a seventh embodiment of the invention, a bottom emission type OLED device is fabricated by combining the process of making a thin film transistor according to the first embodiment of the invention and the process of making an organic light-emitting element 59 according to the fourth embodiment of the invention.

According to a eighth embodiment of the invention, a bottom emission type OLED device is fabricated by combining the process of making a thin film transistor according to the first embodiment of the invention and the process of making an organic light-emitting element 59 according to the fifth embodiment of the invention.

Any reference in this specification to "one embodiment," "an embodiment," "example embodiment," etc., refers to a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a thin film transistor, the method comprising:
- forming a semiconductor pattern on a substrate;
- forming a first insulation film, a conductive film and a metal film on the substrate including the semiconductor pattern;
- forming a first photoresist pattern on the metal film, the first photoresist pattern having a narrower width than that of the semiconductor pattern;
- forming a first metal pattern and a conductive pattern by etching the metal film and the conductive film using the first photoresist pattern as a mask;
- forming a source region and a drain region in the semiconductor pattern by performing a first ion injection process using the first photoresist pattern as a mask;

forming a second photoresist pattern from the first photoresist pattern through an ashing process, the second photoresist pattern having a narrower width than that of the first photoresist pattern;

forming a second metal pattern by etching the first metal pattern using the second photoresist pattern as a mask, wherein the second metal pattern has a narrower width than that of the second photoresist pattern, and the second metal pattern and the conductive pattern form a gate electrode;

performing a process that includes removing the second photoresist pattern, forming LDD (Lightly Doped Drain) regions in the semiconductor pattern, and forming GOLDD (Gate Overlap LDD) regions in the semiconductor pattern;

forming a second insulation film on the substrate including the gate electrode; and forming source and drain electrodes, which are electrically connected to the source and drain regions, respectively, on the second insulation film.

2. The method of claim 1, wherein the performing of the process first forms the LDD (Lightly Doped Drain) regions in the semiconductor pattern through a second ion injection process which uses the second photoresist pattern as a mask, then removes the second photoresist pattern, and then forms the GOLDD (Gate Overlap LDD) regions in the semiconductor pattern through a third ion injection process which uses the second metal pattern as a mask.

3. The method of claim 2, wherein the LDD regions are formed in the semiconductor pattern between the second photoresist pattern and the source and drain regions, respectively.

4. The method of claim 2, wherein the GOLDD regions are formed in the semiconductor pattern between the second metal pattern and the LDD regions, respectively.

5. The method of claim 1, wherein the first metal pattern and the conductive pattern are over etched so that they have a narrower width than that of the first photoresist pattern.

6. The method of claim 1, wherein the source and drain regions are formed in opposite side portions of the semiconductor pattern exposed by the first photoresist pattern.

7. The method of claim 1, wherein the performing of the process first removes the second photoresist pattern, and then forms the LDD (Lightly Doped Drain) regions and GOLDD (Gate Overlap LDD) regions in the semiconductor pattern through a second ion injection process which uses the second metal pattern as a mask.

8. The method of claim 7, wherein the GOLDD regions are formed in the semiconductor pattern between the second metal pattern and the source and drain regions, respectively.

9. The method of claim 7, wherein an ion density difference between the LDD region and the GOLDD region is adjusted by the conductive pattern.

10. The method of claim 1, wherein the conductive film includes a transparent conductive layer.

11. The method of claim 1, wherein the second metal pattern has a size different from a size of the conductive pattern.

12. The method of claim 1, wherein the GOLDD regions have ion densities different from ion densities of the LDD regions.

13. A method of fabricating an organic light-emitting display device, the method comprising:

forming a semiconductor pattern on a substrate;

forming a first insulation film, a conductive film and a metal film on the substrate including the semiconductor pattern;

forming a first photoresist pattern on the metal film, the first photoresist pattern having a narrower width than that of the semiconductor pattern;

forming a first metal pattern and a conductive pattern by etching the metal film and the conductive film using the first photoresist pattern as a mask;

forming a source region and a drain region in the semiconductor pattern by performing a first ion injection process using the first photoresist pattern as a mask;

forming a second photoresist pattern from the first photoresist pattern through an ashing process, the second photoresist pattern having a narrower width than that of the first photoresist pattern;

forming a second metal pattern by etching the first metal pattern using the second photoresist pattern as a mask, wherein the second metal pattern has a narrower width than that of the second photoresist pattern, and the second metal pattern and the conductive pattern form a gate electrode;

performing a process that includes removing the second photoresist pattern, forming LDD (Lightly Doped Drain) regions in the semiconductor pattern, and forming GOLDD (Gate Overlap LDD) regions in the semiconductor pattern;

forming a second insulation film on the entire surface of the substrate;

forming source and drain electrodes, which are electrically connected to the source and drain regions, respectively, on the second insulation film;

forming a first electrode, which is electrically connected to the drain electrode;

forming a bank layer with an opening, which exposes the first electrode; and forming an organic light emission layer and a second electrode on the first electrode.

14. The method of claim 13, wherein the performing of the process first forms the LDD (Lightly Doped Drain) regions in the semiconductor pattern through a second ion injection process which uses the second photoresist pattern as a mask, then removes the second photoresist pattern, and then forms the GOLDD (Gate Overlap LDD) regions in the semiconductor pattern through a third ion injection process which uses the second metal pattern as a mask.

15. The method of claim 13, wherein the performing of the process first removes the second photoresist pattern, then forms the LDD (Lightly Doped Drain) regions and GOLDD (Gate Overlap LDD) regions in the semiconductor pattern through a second ion injection process which uses the second metal pattern as a mask.

16. A method of fabricating an organic light-emitting display device, the method comprising:

forming first and second semiconductor patterns on a substrate with first through third regions;

forming a first insulation film, a conductive film and a metal film on the substrate including the first and second semiconductor patterns;

forming first through third photoresist patterns on the metal film corresponding to the first through third regions, while the first photoresist pattern has a narrower width than that of the first semiconductor pattern, and the second photoresist pattern corresponds to the second semiconductor pattern;

forming first through third metal patterns and first through third conductive patterns by etching the metal film and the conductive film using the first through third photoresist patterns as a mask;

forming a source region and a drain region in the first semiconductor pattern by performing a first ion injection process using the first photoresist pattern as a mask;

forming a fourth photoresist pattern from the first photoresist pattern with a narrower width than that of the first photoresist pattern while removing the second and third photoresist patterns by performing an ashing process;

forming a fourth metal pattern, a second capacitor electrode and a first electrode, wherein the fourth metal pattern is formed from the first metal pattern by etching the first metal pattern using the fourth photoresist pattern as a mask and has a narrower width than that of the fourth photoresist pattern, and the second capacitor electrode and the first electrode are formed from the second and third conductive patterns by removing the second and third metal patterns, wherein the fourth metal pattern and the first conductive pattern form a gate electrode;

removing the fourth photoresist pattern;

performing a process that includes removing the second photoresist pattern, forming LDD (Lightly Doped Drain) regions in the semiconductor pattern, and forming GOLDD (Gate Overlap LDD) regions in the semiconductor pattern;

forming a second insulation film on the entire surface of the substrate;

forming a first opening, which exposes the first electrode, in the second insulation film;

forming a source electrode which is electrically connected to the source region, and a drain electrode which is electrically connected to the drain region and the first electrode, on the second insulation film;

forming a bank layer with a second opening, which exposes the first electrode, on the second insulation film; and forming an organic light emission layer and a second electrode, which form an organic light-emitting element together with the first electrode, on the first electrode.

17. The method of claim 16, wherein the performing of the process first forms the LDD (Lightly Doped Drain) regions in the semiconductor pattern through a second ion injection process which uses the second photoresist pattern as a mask, then removes the second photoresist pattern, and then forms the GOLDD (Gate Overlap LDD) regions in the semiconductor pattern through a third ion injection process which uses the second metal pattern as a mask.

18. The method of claim 16, wherein the performing of the process first removes the second photoresist pattern, then forms the LDD (Lightly Doped Drain) regions and GOLDD (Gate Overlap LDD) regions in the semiconductor pattern through a second ion injection process which uses the second metal pattern as a mask.

19. The method of claim 16, wherein the drain electrode is disposed on the second insulating film between the drain region and the first electrode spaced apart from each other.

20. A method of fabricating an organic light-emitting display device, the method comprising:

forming first and second semiconductor patterns on a substrate with first through third regions;

forming a first insulation film, a conductive film and a first metal film on the substrate including the first and second semiconductor patterns;

forming first through third photoresist patterns on the metal film corresponding to the first through third regions, while the first photoresist pattern has a narrower width than that of the first semiconductor pattern, and the second photoresist pattern corresponds to the second semiconductor pattern;

forming first through third metal patterns and first through third conductive patterns by etching the first metal film and the conductive film using the first through third photoresist patterns as a mask;

forming a source region and a drain region in the first semiconductor pattern by performing a first ion injection process using the first photoresist pattern as a mask;

forming fourth and fifth photoresist patterns by performing an ashing process while fourth photoresist pattern has a narrower width than that of the first photoresist pattern;

forming a fourth metal pattern and a second capacitor electrode, wherein the fourth metal pattern is formed from the first metal pattern by etching the first metal pattern using the fourth photoresist pattern as a mask and has a narrower width than that of the fourth photoresist pattern, and the second capacitor electrode is formed from the second conductive pattern;

removing the fourth and fifth photoresist patterns;

performing a process that includes removing the second photoresist pattern, forming LDD (Lightly Doped Drain) regions in the semiconductor pattern, and forming GOLDD (Gate Overlap LDD) regions in the semiconductor pattern;

forming a second insulation film on the entire surface of the substrate;

forming a first opening, which exposes the third metal pattern, in the second insulation film;

forming a source electrode, a drain electrode, a connection electrode and a first electrode by depositing a second metal film on the second insulation film and patterning the second metal film and the third metal pattern;

forming a bank layer with a second opening, which exposes the first electrode, on the second insulation film; and forming an organic light emission layer and a second electrode, which form an organic light-emitting element together with the first electrode, on the first electrode.

21. The method of claim 20, wherein the connection electrode is formed to include an edge portion of the third metal pattern and the first electrode is formed to include the third conductive pattern, by selectively etching the third metal pattern.

22. The method of claim 20, wherein the performing of the process first forms the LDD (Lightly Doped Drain) regions in the semiconductor pattern through a second ion injection process which uses the second photoresist pattern as a mask, then removes the second photoresist pattern, and then forms the GOLDD (Gate Overlap LDD) regions in the semiconductor pattern through a third ion injection process which uses the second metal pattern as a mask.

23. The method of claim 20, wherein the performing of the process first removes the second photoresist pattern, then forms the LDD (Lightly Doped Drain) regions and GOLDD (Gate Overlap LDD) regions in the semiconductor pattern through a second ion injection process which uses the second metal pattern as a mask.

* * * * *